US012757787B2

(12) United States Patent
Jang

(10) Patent No.: US 12,757,787 B2
(45) Date of Patent: Oct. 6, 2026

(54) LIGHT EMITTING DEVICE HAVING A FIRST LIGHT EMITTING DEVICE AND A SECOND LIGHT EMITTING DEVICE DISPOSED LATERALLY ADJACENT THERETO, AND DISPLAY APPARATUS INCLUDING THE LIGHT EMITTING DEVICE

(71) Applicant: SEOUL VIOSYS CO., LTD., Ansan-si (KR)

(72) Inventor: Jong Min Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 563 days.

(21) Appl. No.: 18/139,285

(22) Filed: Apr. 25, 2023

(65) Prior Publication Data

US 2023/0369304 A1 Nov. 16, 2023

Related U.S. Application Data

(60) Provisional application No. 63/458,919, filed on Apr. 12, 2023, provisional application No. 63/402,908, (Continued)

(51) Int. Cl.

*H10W 90/00* (2026.01)
*H10H 20/824* (2025.01)
*H10H 29/10* (2025.01)

(52) U.S. Cl.

CPC .......... *H10W 90/00* (2026.01); *H10H 20/824* (2025.01); *H10H 29/10* (2025.01)

(58) Field of Classification Search

CPC . H01L 25/167; H01L 25/162; H01L 25/0753; H10H 20/824; H10H 29/10;
(Continued)

(56) References Cited

U.S. PATENT DOCUMENTS 10,103,195 B2 10/2018 Damilano et al.
2016/0372514 A1 12/2016 Chang
(Continued)

FOREIGN PATENT DOCUMENTS

CN 114725151 A 7/2022
CN 114899286 A 8/2022
(Continued)

OTHER PUBLICATIONS

International Search Report dated Aug. 17, 2023, issued to International Application No. PCT/KR2023/006213 (with English Translation).

(Continued)

*Primary Examiner* — Mounir S Amer
*Assistant Examiner* — Nicholas B Michaud
(74) *Attorney, Agent, or Firm* — Oblon, McClelland, Maier & Neustadt, L.L.P.

(57) ABSTRACT

A pixel device including a first light emitting device; a second light emitting device disposed laterally adjacent to the first light emitting device; a first cover layer covering the first light emitting device and the second light emitting device; and connection layers disposed on the first cover layer, and electrically connected to the first and second light emitting devices, in which the first light emitting device includes a first light emitting structure, and the second light emitting device includes a second light emitting structure and a third light emitting structure, in which the first light emitting structure emits light having a peak wavelength longer than peak wavelengths of light emitted from the second and third light emitting structures, and the second and third light emitting structures emit light having different peak wavelengths from each other.

20 Claims, 18 Drawing Sheets

Related U.S. Application Data filed on Aug. 31, 2022, provisional application No. 63/340,886, filed on May 11, 2022.

(58) Field of Classification Search

CPC .... H10H 20/84; H10H 20/857; H10H 20/819; H10H 20/825; H10H 29/14

USPC .............................................................. 257/89

See application file for complete search history.

(56) References Cited

U.S. PATENT DOCUMENTS

| | | | |
|---|---|---|---|
| 2017/0213868 A1 | 7/2017 | Damilano et al. | |
| 2019/0164945 A1* | 5/2019 | Chae | H10H 20/857 |
| 2019/0181306 A1 | 6/2019 | Juang et al. | |
| 2019/0189681 A1 | 6/2019 | Chae | |
| 2019/0229097 A1* | 7/2019 | Takeya | H01L 21/6835 |
| 2020/0266233 A1 | 8/2020 | Iguchi et al. | |
| 2021/0050475 A1* | 2/2021 | Tsai | H10H 20/018 |
| 2021/0098526 A1* | 4/2021 | Cho | H01L 25/0753 |
| 2021/0118946 A1 | 4/2021 | Simon | |
| 2021/0305220 A1 | 9/2021 | Xu et al. | |
| 2021/0384388 A1 | 12/2021 | Cha et al. | |

FOREIGN PATENT DOCUMENTS

| | | |
|---|---|---|
| EP | 3 840 066 A1 | 6/2021 |
| JP | 6907463 B2 | 7/2021 |
| KR | 10-2016-0139004 | 12/2016 |
| KR | 10-2017-0010132 | 1/2017 |
| KR | 10-2020-0051912 A | 5/2020 |
| KR | 10-2020-0087174 | 7/2020 |
| KR | 10-2021-0072006 A | 6/2021 |
| KR | 10-2384663 B1 | 4/2022 |
| KR | 10-2022-0061912 A | 5/2022 |
| WO | 2021-060878 | 4/2021 |
| WO | 2021-251717 | 12/2021 |

OTHER PUBLICATIONS

International Search Report issued Nov. 27, 2023, in PCT/KR2023/012136, 2 pages.

Office Action mailed Oct. 23, 2025, in co-pending U.S. Appl. No. 18/232,652, filed Aug. 10, 2023.

Office Action mailed Mar. 18, 2026, in co-pending U.S. Appl. No. 18/232,652, filed Aug. 10, 2023.

Office Action mailed Apr. 8, 2026, in co-pending U.S. Appl. No. 18/443,115, filed Feb. 15, 2024.

Extended European Search Report mailed Mar. 25, 2026, in European Application No. 23803782.4 filed May 8, 2023.

Office Action mailed Jun. 3, 2026, in India Application No. 202417082880 filed Oct. 29, 2024.

Extended European Search Report mailed Jul. 13, 2026, In European Application No. 23860739.4 filed Aug. 17, 2023 (citing document Nos. 1 and 19 therein).

* cited by examiner

LIGHT EMITTING DEVICE HAVING A FIRST LIGHT EMITTING DEVICE AND A SECOND LIGHT EMITTING DEVICE DISPOSED LATERALLY ADJACENT THERETO, AND DISPLAY APPARATUS INCLUDING THE LIGHT EMITTING DEVICE

CROSS REFERENCE TO RELATED APPLICATIONS

This application claims the benefit of United States Provisional Patent Application No. 63/340,886, filed on May 11, 2022, U.S. Provisional Patent Application No. 63/402,908, filed on Aug. 31, 2022, and U.S. Provisional Patent Application No. 63/458,919, filed on Apr. 12, 2023, which are hereby incorporated by reference for all purposes as if fully set forth herein.

BACKGROUND

Field

Exemplary embodiments relate to a pixel device and a display apparatus including the same, and more particularly, to a pixel device configured to emit light of various colors and a display apparatus including the same.

Discussion of the Background

Light emitting device are semiconductor devices using a light emitting diode which is an inorganic light source, and are widely used in various fields such as display apparatuses, vehicle lamps, and general lightings. As the light emitting diodes have advantages, such as longer lifespan, lower power consumption, and quicker response than conventional light sources, the light emitting diodes have been replacing the conventional light sources.

Conventional light emitting diodes have been generally used as backlight light sources in display apparatuses. Recently, display apparatuses that directly realize images using the light emitting diodes have been developed. Such displays are also referred to as micro LED displays.

In general, the display apparatus displays various colors through mixture of blue, green, and red light. In order to realize various images, the display apparatus includes a plurality of pixels to implement various images, and each pixel has blue, green, and red sub-pixels. As such, a color of a certain pixel is typically determined based on the colors of the sub-pixels, so that images can be displayed through the combination of such pixels.

In a case of the micro LED display, micro LEDs are arranged on a plane corresponding to each sub-pixel, and a large number of micro LEDs are mounted on a single substrate. However, since the micro LED is extremely small, for example, 200 μm or less, further 100 μm or less, it is difficult to transfer the entire micro LEDs to one circuit board. In order to reduce the number of micro LEDs, a pixel module having a structure in which blue, green, and red light emitting devices are vertically stacked is used, but the luminous intensity of red light is relatively low.

The above information disclosed in this Background section is only for understanding of the background of the inventive concepts, and, therefore, it may contain information that does not constitute prior art.

SUMMARY

Exemplary embodiments provide a pixel device capable of preventing a decrease in luminous intensity of red light while reducing the number of mounted micro LEDs, and a display apparatus having the same.

Exemplary embodiments also provide a pixel device having an improved structure to further increase in luminous intensity of red light, and a display apparatus having the same.

Additional features of the inventive concepts will be set forth in the description which follows, and in part will be apparent from the description, or may be learned by practice of the inventive concepts.

A pixel device according to an exemplary embodiment includes a first light emitting device; a second light emitting device disposed laterally adjacent to the first light emitting device; a first cover layer covering the first light emitting device and the second light emitting device; and connection layers disposed on the first cover layer, and electrically connected to the first and second light emitting devices, in which the first light emitting device includes a first light emitting structure, and the second light emitting device includes a second light emitting structure and a third light emitting structure, in which the first light emitting structure emits light having a peak wavelength longer than peak wavelengths of light emitted from the second and third light emitting structures, and the second and third light emitting structures emit light having different peak wavelengths from each other.

The first light emitting structure may include an arsenic or phosphide-based semiconductor layer, and the second and third light emitting structures may include a nitride-based semiconductor layer.

The second light emitting structure and the third light emitting structure may be stacked in a vertical direction.

The pixel device may further include an adhesive layer coupling the second light emitting structure and the third light emitting structure.

The second light emitting structure and the third light emitting structure may include a first conductivity type semiconductor layer, an active layer, and a second conductivity type semiconductor layer, respectively, the first conductivity type semiconductor layers of the second and third light emitting structures may be electrically connected to each other, and the second conductivity type semiconductor layers of the second and third light emitting structures may be electrically spaced apart from each other.

The second light emitting device may include an electrode pad electrically connecting the first conductivity type semiconductor layers of the second and third light emitting structures, and one of the connection layers may be electrically connected to the electrode pad.

The second light emitting device may include electrode pads electrically connected to the first conductivity type semiconductor layers of the second and third light emitting structures, respectively, and one of the connection layers may be connected to the electrode pads to electrically connect the electrode pads.

The third light emitting structure may be disposed on the second light emitting structure, and the third light emitting structure may emit light having a peak wavelength shorter than that of the second light emitting structure.

The pixel device may further include a substrate, the first and second light emitting devices may be disposed on the substrate, and an upper surface of the substrate facing the first and second light emitting devices may include a concavo-convex pattern.

Bottom surfaces of the first and second light emitting devices facing the substrate may have a concavo-convex pattern.

The pixel device may further include a second cover layer covering the first cover layer and the connection layers, and the second cover layer may be disposed to partially expose the connection layers.

The second cover layer may be formed of a same material as that of the first cover layer.

The first and second cover layers may be formed of polyimide.

The second cover layer may cover portions of edges of the connection layers.

The first light emitting device may further include a sub light emitting structure in addition to the first light emitting structure, and the sub light emitting structure may emit light having a peak wavelength longer than the peak wavelengths of light emitted from the second and third light emitting structures.

The first light emitting structure and the sub light emitting structure may be bonded to each other using a tunnel layer.

The first light emitting structure and the sub light emitting structure may emit light of a same color.

A display apparatus according to an embodiment of the present disclosure may include a circuit board; and a pixel device disposed on the circuit board, in which the pixel device may be the pixel device described above.

A light emitting diode according another exemplary embodiment includes a first light emitting stack, a second light emitting stack disposed over the first light emitting stack, a third light emitting stack disposed over the second light emitting stack, and an adhesive layer bonding the first light emitting stack and the second light emitting stack. At least a portion of light emitted from the second light emitting stack may be emitted by passing through a region disposed between a side surface of the first light emitting stack and an upper portion of the second light emitting stack. In addition, the first light emitting stack may include a region in which at least a portion thereof does not overlap with the third light emitting stack in plan view, and may be disposed to overlap with at least a portion of the second light emitting stack. In addition, the first light emitting stack may be disposed on a peripheral portion to surround the second light emitting stack and the third light emitting stack, and the second light emitting stack and the third light emitting stack may be disposed on a central region of the light emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
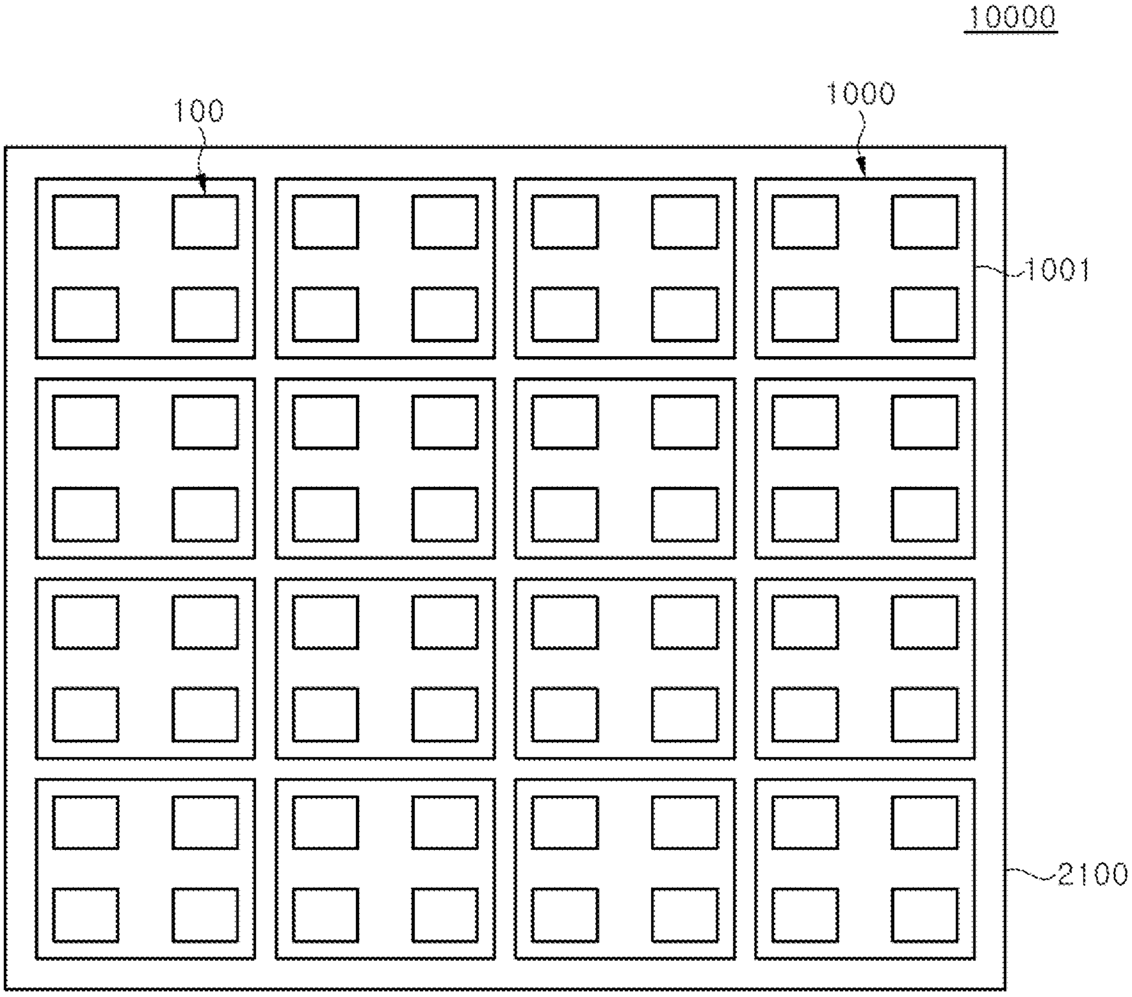
FIG. 1A is a schematic plan view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
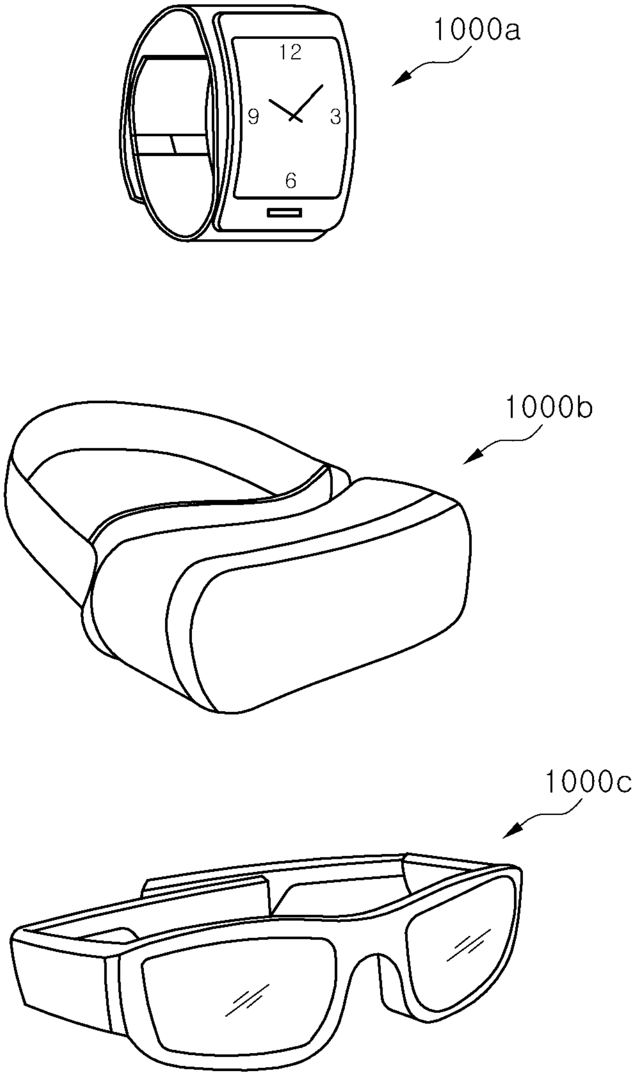
FIG. 1B is a schematic perspective view illustrating various display apparatuses according to an exemplary embodiment.
Figure 1C:
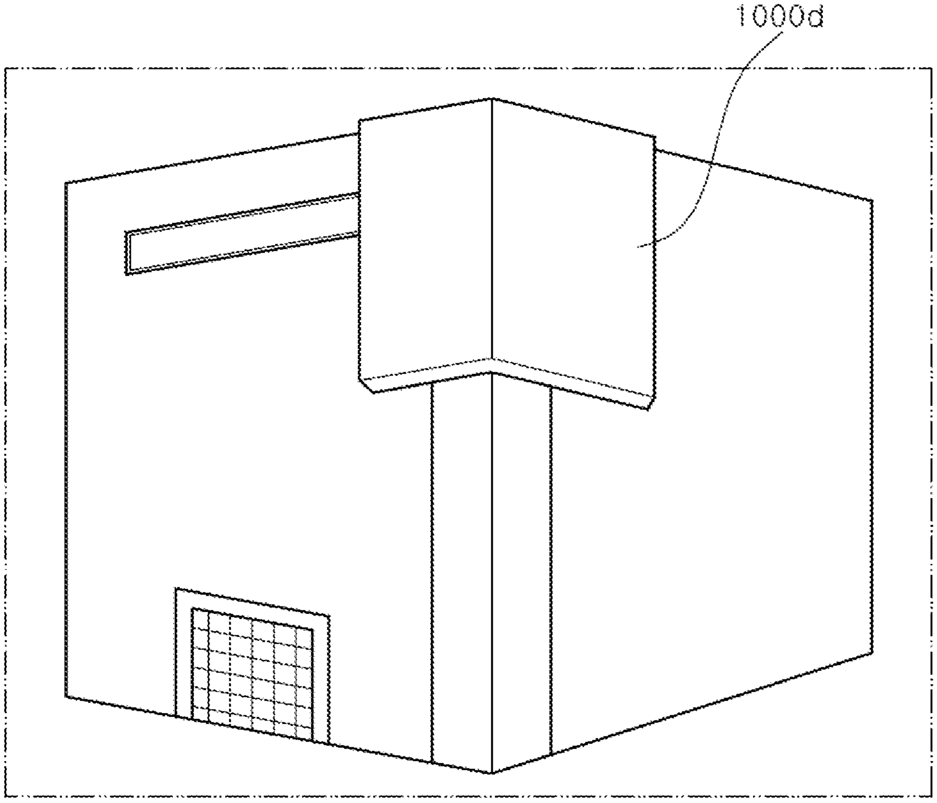
FIG. 1C is a schematic perspective view illustrating another display apparatus according to an exemplary embodiment.
Figure 1D:
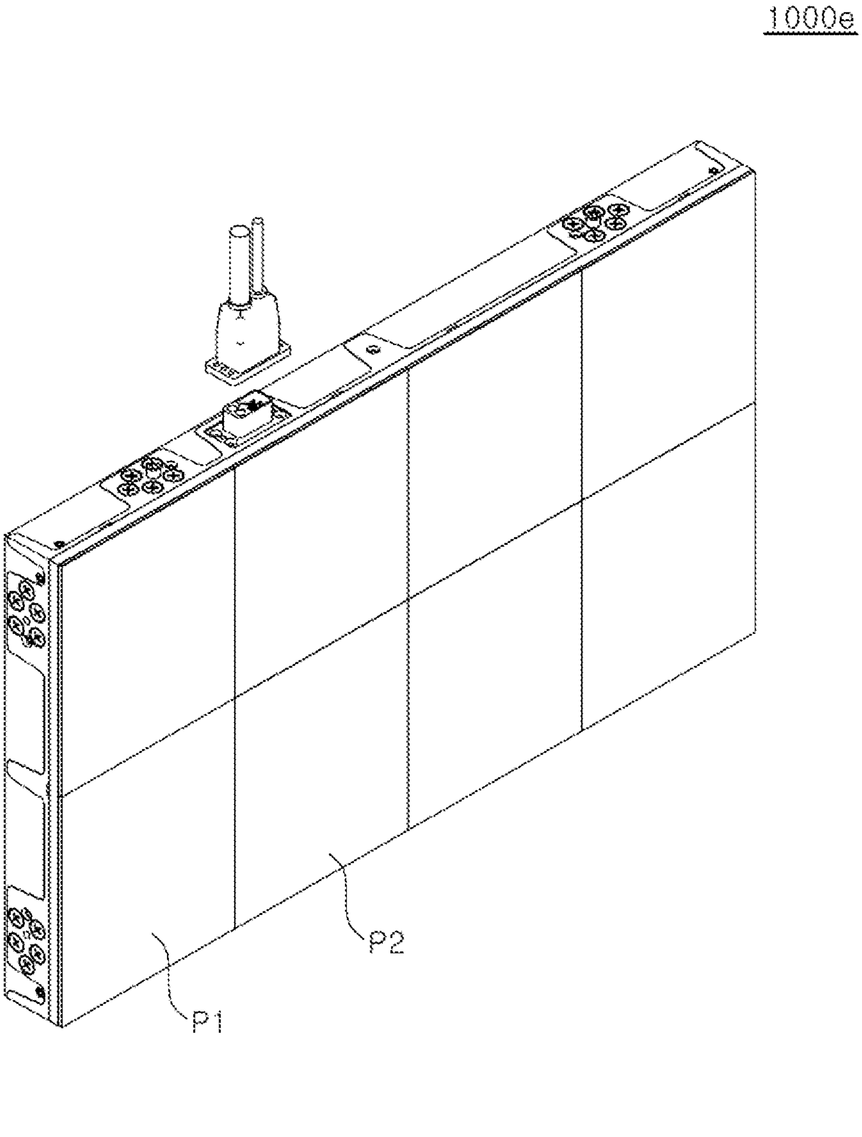
FIG. 1D is a schematic perspective view illustrating another display apparatus according to an exemplary embodiment.

FIG. 1A is a schematic plan view illustrating a display apparatus according to an exemplary embodiment, and FIGS. 1B, 1C, and 1D are schematic perspective views illustrating various display apparatuses 1000*a*, 1000*b*, 1000*c*, and 1000*d* according to an exemplary embodiment.

Referring to FIG. 1A, a display apparatus 10000 may include a panel substrate 2100 and a plurality of pixel modules 1000.

The display apparatus 10000 is not particularly limited, but may include a smart watch 1000*a*, a wearable display apparatus 1000*b* such as a VR headset or glasses, an AR display apparatus 1000*c* such as augmented reality glasses, or an indoor or outdoor display apparatus 1000*d* or 1000*e* such as a micro LED TV or signage, as exemplarily shown in FIGS. 1B, 1C, and 1D. The panel substrate 2100 and the plurality of pixel modules 1000 may be disposed in the display apparatus.

The panel substrate 2100 may be formed of a material such as polyimide (PI), FR4, or glass, and may include a circuit for driving a passive matrix or an active matrix. In an exemplary embodiment, the panel substrate 2100 may include interconnections and resistors therein. In another exemplary embodiment, the panel substrate 2100 may include interconnections, transistors, and capacitors. In addition, the panel substrate 2100 may have pads on its upper surface to be electrically connected to circuits.

A plurality of light emitting modules 1000 may be arranged on the panel substrate 2100. The light emitting modules 1000 may be disposed with an interval therebetween, or may be disposed to be in close contact with one another. The interval between the light emitting modules 1000 may be set in consideration of an interval between pixels 100 which will be described later. For example, the interval between two adjacent pixels 100 disposed in adjacent light emitting modules 1000, respectively, may be substantially the same as an interval between pixels 100 in one light emitting module 1000. However, the inventive concepts are not necessarily limited thereto. The unit pixel 100 will be described in detail with reference to FIGS. 2A through 2C.

Figure 2A:
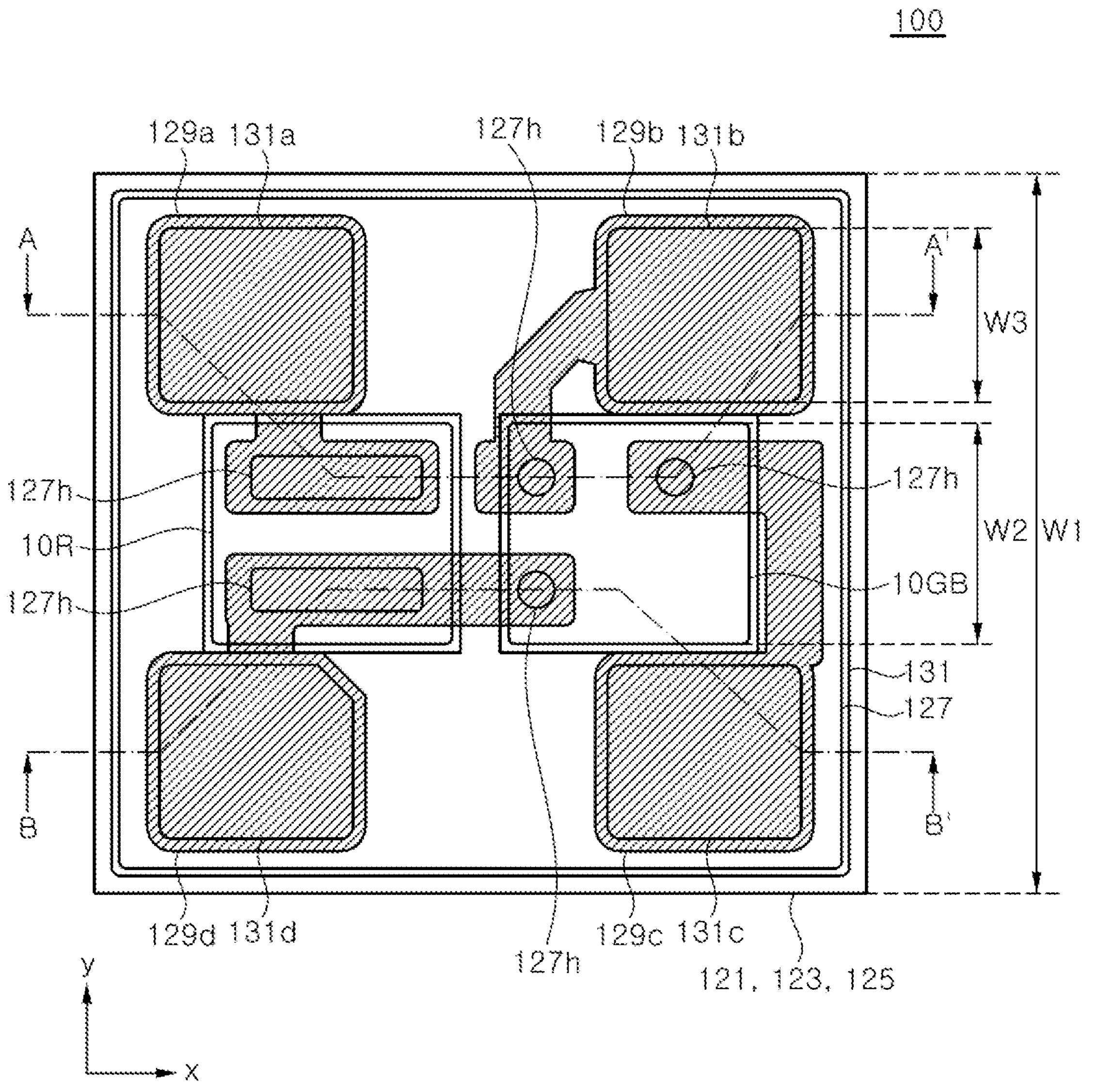
FIG. 2A is a schematic plan view illustrating a pixel device according to an exemplary embodiment.
Figure 2B:
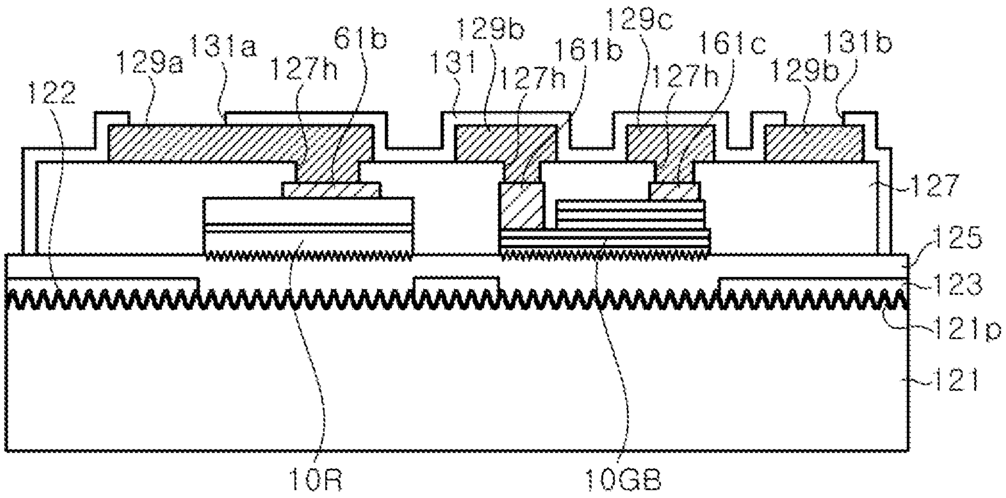
FIG. 2B is a schematic cross-sectional view taken along line A-A' in FIG. 2A.
Figure 2C:
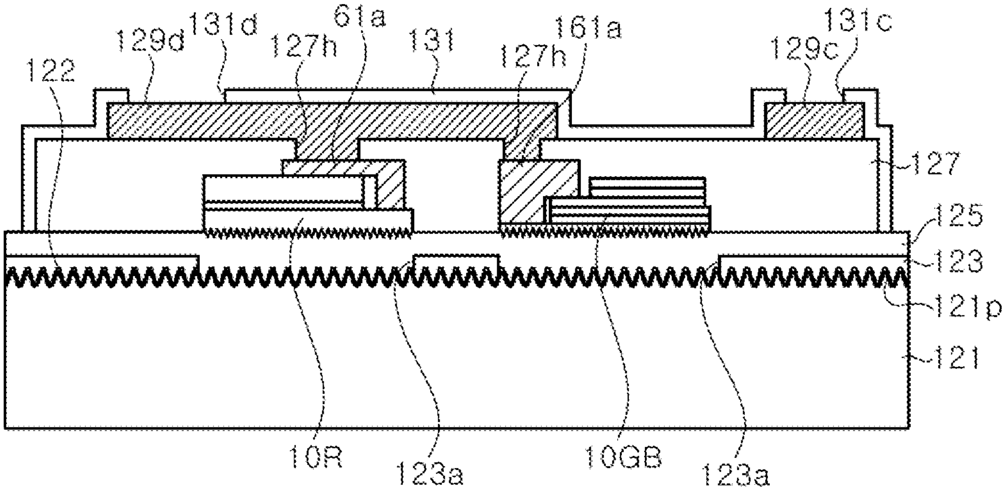
FIG. 2C is a schematic cross-sectional view taken along line B-B' in FIG. 2A.

FIG. 2A is a schematic plan view illustrating a pixel device according to an exemplary embodiment, FIG. 2B is a schematic cross-sectional view taken along line A-A' in FIG. 2A, and FIG. 2C is a schematic cross-sectional view taken along line B-B' in FIG. 2A.

Referring to FIGS. 2A, 2B, and 2C, a pixel device 100 may include a first light emitting device 10R, a second light emitting device 10GB, and connection layers 129*a*, 129*b*, 129*c*, and 129*d*. In some exemplary embodiments, the pixel device 100 may further include a transparent substrate 121, a surface layer 122, a light blocking layer 123, an adhesive layer 125, a first cover layer 127, and/or a second cover layer 131.

The pixel device 100 may constitute one pixel capable of implementing various colors by including the first and second light emitting devices 10R and 10GB. The first and second light emitting devices 10R and 10GB will be described in detail later with reference to FIGS. 3A, 3B, 4A, and 4B.

The transparent substrate 121 is a light transmissive substrate such as PET, glass substrate, quartz, or sapphire substrate. The transparent substrate 121 is disposed on a light exiting surface of a light emitting module 1000, and light emitted from the light emitting devices 10R and 10GB is emitted to the outside through the transparent substrate 121. The transparent substrate 121 may have upper and lower surfaces. The transparent substrate 121 may include a concavo-convex pattern 121*p* on a surface facing the light emitting devices 10R and 10GB, that is, the upper surface. The concavo-convex pattern 121*p* scatters light emitted from the light emitting devices 10R and 10GB to increase a viewing angle. In addition, light emitted from the light emitting devices 10R and 10GB, which have different viewing angle characteristics, may be emitted at a uniform viewing angle by the concavo-convex pattern 121*p*. Accordingly, it is possible to prevent a color difference from occurring depending on an angle at which a user sees an image.

The concavo-convex pattern 121*p* may be regular or irregular. The concavo-convex pattern 121*p* may have, for example, a pitch of 3 μm, a diameter of 2.8 μm, and a height of 1.8 μm. The concavo-convex pattern 121*p* may be generally a pattern applied to a patterned sapphire substrate, without being limited thereto.

The transparent substrate 121 may also include an anti-reflection coating, or may include an anti-glare layer or be treated with an anti-glare treatment. The transparent substrate 121 may have a thickness of, for example, 50 μm to 300 μm. The thickness of the transparent substrate 121 may be greater than a thickness of each of the light emitting devices 10R and 10GB.

Since the transparent substrate 121 is disposed on the light exiting surface, the transparent substrate 121 does not include a circuit. However, the inventive concepts are not limited thereto, and the transparent substrate 121 may include a circuit in some exemplary embodiments. Meanwhile, although one pixel device 100 is illustrated as being formed on one transparent substrate 121, a plurality of pixel devices 100 may be formed on one transparent substrate 121 in some exemplary embodiments.

The surface layer 122 may cover the concavo-convex pattern 121*p* of the transparent substrate 121. The surface layer 122 may be formed along a shape of the concavo-convex pattern 121*p*. The surface layer 122 may improve adhesion of the light blocking layer 123 formed thereon. For example, the surface layer 122 may be formed of a silicon oxide layer. The surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include a light absorbing material, such as carbon black. The light absorbing material prevents light generated from the light emitting devices 10R and 10GB from leaking to a side surface in a region between the transparent substrate 121 and the light emitting devices 10R and 10GB, and improves a contrast of the display apparatus.

The light blocking layer 123 may have windows 123*a* for a light progression path so that light generated from the light emitting devices 10R and 10GB is incident on the transparent substrate 121. In particular, the light blocking layer 123 may be patterned to expose the transparent substrate 121. Widths of the windows 123*a* may be wider than that of the light emitting device, without being limited thereto. In some exemplary embodiments, the widths of the windows 123*a* may be smaller than or equal to the width of the light emitting device.

The window 123*a* of the light blocking layer 123 also defines alignment positions of the light emitting devices 10R and 10GB. Accordingly, additional alignment markers for defining the alignment positions of the light emitting devices 10R and 10GB may be omitted. However, the inventive concepts are not limited thereto, and the alignment markers may be provided on the transparent substrate 121, or on the light blocking layer 123 or the adhesive layer 125 to provide the alignment positions of the light emitting devices 10R and 10GB. In some exemplary embodiments, the light blocking layer 123 may be omitted.

The adhesive layer 125 is attached on the transparent substrate 121. The adhesive layer 125 is disposed between the upper surface of the transparent substrate 121 having the concavo-convex pattern 121*p* and the light emitting devices 10R and 10GB. The adhesive layer 125 may cover the light blocking layer 123. The adhesive layer 125 may be attached on an entire surface of the transparent substrate 121, without being limited thereto. In some exemplary embodiments, the adhesive layer 125 may be attached to a portion of the transparent substrate 121 to expose a region near an edge of the transparent substrate 121. The adhesive layer 125 is used to attach the light emitting devices 10R and 10GB to the transparent substrate 121. The adhesive layer 125 may fill the window 123*a* formed in the light blocking layer 123.

The adhesive layer 125 may be formed of a light transmissive layer, and transmits light emitted from the light emitting devices 10R and 10GB. The adhesive layer 125 may be formed using an organic adhesive. For example, the adhesive layer 125 may be formed using transparent epoxy. In addition, the adhesive layer 125 may include a diffuser such as $SiO_2$, $TiO_2$, ZnO, or the like to diffuse light. The light diffuser material prevents the light emitting devices 10R and 10GB from being viewed from the light exiting surface.

As shown in FIGS. 2B and 2C, the adhesive layer 125 may cover portions of the side surfaces of the light emitting devices 10R and 10GB. More particularly, portions of the light emitting devices 10R and 10GB may be embedded into the adhesive layer 125, accordingly, detachment of the light emitting devices 10R and 10GB may be prevented, and furthermore, it is possible to prevent moisture from infiltrating into an interface between the adhesive layer 125 and the light emitting devices 10R and 10GB. Meanwhile, the adhesive layer 125 covers the concavo-convex pattern 121*p*, and accordingly, it may include regions having different thicknesses. A region where the thickness of the adhesive layer 125 is large improves an adhesion of the adhesive layer 125. In addition, the light emitting devices 10R and 10GB may be peeled off by heat generated when the light emitting devices 10R and 10GB are driven. However, since a thick region and a thin region of the adhesive layer 125 coexist, it is possible to prevent peeling of the light emitting devices 10R and 10GB by accommodating heat-induced contraction and expansion.

The first and second light emitting devices 10R and 10GB are disposed on the transparent substrate 121. The first and second light emitting devices 10R and 10GB may be attached to the transparent substrate 121 by the adhesive layer 125. The first and second light emitting devices 10R and 10GB may be disposed to correspond to the windows 123*a* of the light blocking layer 123. When the light blocking layer 123 is omitted, alignment markers may be added to provide the alignment positions of the light emitting devices 10R and 10GB. The first and second light emitting devices 10R and 10GB may share one transparent substrate 121. The first and second light emitting devices 10R and 10GB may be disposed adjacent to each other. The first light emitting device 10R may be disposed in a first region of the pixel device 100, and the second light emitting device 10GB may be disposed in a second region of the pixel device 100. The first light emitting device 10R may include a first light emitting structure that emits light having a longest peak wavelength in the pixel device 100, and the second light emitting device 10GB may include second and third light emitting structures that emit light having a peak wavelength shorter than that of the first light emitting device 10R. The second and third light emitting structures may emit light having different peak wavelengths from each other.

As shown in FIG. 2A, the first and second light emitting devices 10R and 10GB may be arranged in a line. The first light emitting structure may have a thickness greater than that of each of the second and third light emitting structures. In addition, a first surface of the first light emitting structure disposed in the first region may face first surfaces of the second light emitting structure and the third light emitting structure disposed in the second region. A vertical height of the first surface of the first light emitting structure may be smaller than a sum of vertical heights of the first surfaces of the second and third light emitting structures disposed in the second region. In addition, a peak wavelength of light emitted from the first region may be different from that of light emitted from the second region. Also, color coordinates of light emitted from the first region and color coordinates of light emitted from the second region may be different from each other, and white light may be generated by simultaneously applying current to the first region and the second region. The second light emitting structure may include an upper surface disposed to face a light-transmissive substrate, and may include a lower surface disposed opposite to the upper surface. The third light emitting structure may be stacked and disposed on the lower surface of the second light emitting structure. At least portions of the second light emitting structure and the third light emitting structure may be disposed to overlap each other, and thus, the pixel device may be miniaturized.

For example, the first light emitting structure of the first light emitting device 10R may have a smallest band gap energy, and may emit red light. The second light emitting structure of the second light emitting device 10GB may have a band gap energy greater than that of the first light emitting structure, and may emit green light. The third light emitting structure of the second light emitting device 10GB may have a band gap energy greater than that of the second light emitting structure, and may emit blue light. Since the first light emitting device 10R emitting red light does not overlap with the light emitting structures emitting light of different peak wavelengths, red light may be emitted to the outside without loss of light that may occur while passing through other light emitting structures, and thus, an emission efficiency of red light may be increased.

A specific configuration of the first light emitting device 10R will be described later in detail with reference to FIGS. 3A and 3B, and a specific configuration of the second light emitting device 10GB will be described with reference to FIGS. 4A and 4B.

The first cover layer 127 covers the first and second light emitting devices 10R and 10GB. The first cover layer 127 has openings 127*h* exposing electrode pads of the light emitting devices 10R and 10GB. The first cover layer 127 facilitates forming of the connection layers 129*a*, 129*b*, 129*c*, and 129*d* securely by evenly adjusting elevations of surfaces on which the connection layers 129*a*, 129*b*, 129*c*, and 129*d* are formed. The first cover layer 127 may be formed of a material, such as polyimide, an epoxy molding compound, silicone, or the like. The first cover layer 127 may include a light reflective or light absorbing material. A lower end of the first cover layer 127 covering the first and second light emitting devices 10R and 10GB may be in contact with the adhesive layer 125, and thus, the light emitting devices 10R and 10GB are embedded in the adhesive layer 125 and the first cover layer 127, so that a device deformation, such as warpage, and damage may be prevented during a process of moving and mounting the pixel device 100.

The first cover layer 127 may be disposed in a region surrounded by an edge of the adhesive layer 125, without being limited thereto. For example, the first cover layer 127 may be formed to partially expose the edge of the adhesive layer 125 in some exemplary embodiments.

First through fourth connection layers 129*a*, 129*b*, 129*c*, and 129*d* are formed on the first cover layer 127. The first through fourth connection layers 129*a*, 129*b*, 129*c*, and 129*d* may be connected to electrode pads 61*a*, 61*b*, 161*a*, 161*b*, and 161*c* of the first and second light emitting devices 10R and 10GB through the openings 127*h* of the first cover layer 127. The first through fourth connection layers 129*a*, 129*b*, 129*c*, and 129*d* are electrically connected to the first and second light emitting devices 10R and 10GB, and extend to the outside of the first and second regions where the first and second light emitting devices 10R and 10GB are disposed.

In an exemplary embodiment, as shown in FIGS. 2A and 2B, the first connection layer 129*a* may be electrically connected to a second conductivity type semiconductor layer of the first light emitting structure of the first light emitting device 10R, the second connection layer 129*b* may be electrically connected to a second conductivity type semiconductor layer of the second light emitting structure of the second light emitting device 10GB, the third connection layer 129*c* may be electrically connected to a second conductivity type semiconductor layer of the third light emitting structure of the second light emitting device 10GB, and the fourth connection layer 129*d* may be commonly electrically connected to first conductivity type semiconductor layers of the first and second light emitting devices 10R and 10GB. In another exemplary embodiment, the first connection layer 129*a* may be electrically connected to the first conductivity type semiconductor layer of the first light emitting structure of the first light emitting device 10R, the second connection layer 129*b* may be electrically connected to the first conductivity type semiconductor layer of the second light emitting structure of the second light emitting device 10GB, the third connection layer 129*c* may be electrically connected to the first conductivity type semiconductor layer of the third light emitting structure of the second light emitting device 10GB, and the fourth connection layer 129*d* may be commonly electrically connected to the second conductivity type semiconductor layers of the first and second light emitting devices 10R and 10GB. The first through fourth connection layers 129*a*, 129*b*, 129*c*, and 129*d* may be formed together on the first cover layer 127, and may include, for example, Au.

The second cover layer 131 may be formed to have a thickness smaller than that of the first cover layer 127. A sum of the thicknesses of the second cover layer 131 and the first cover layer 127 may be greater than or equal to 1 μm and less than or equal to 50 μm, without being limited thereto.

The second cover layer 131 may cover side surfaces of the first cover layer 127 and the connection layers 129*a*, 129*b*, 129*c*, and 129*d*. In addition, the second cover layer 131 may cover a portion of the adhesive layer 125. The second cover layer 131 has openings 131*a*, 131*b*, 131*c*, and 131*d* exposing the connection layers 129*a*, 129*b*, 129*c*, and 129*d*, and thus, pad regions of the pixel device 100 may be defined. Each of the pad regions may be disposed close to corners of the pixel device 100, and may be disposed symmetrically with respect to a center line passing through a center of the pixel device 100. The pad regions may be formed outside of upper regions of the first and second light emitting devices 10R and 10GB not to overlap with the first and second light emitting devices 10R and 10GB in a vertical direction. However, the inventive concepts are not necessarily limited thereto.

A length of at least one edge of the pad regions may be 25% or less of a length of at least one edge of the pixel device 100. Edges of the connection layers 129*a*, 129*b*, 129*c*, and 129*d* may be covered with the second cover layer 131, and the pad regions may be covered with pads on a circuit board or a bonding material.

In an exemplary embodiment, the second cover layer 131 may include a translucent material, and may be formed of an organic or inorganic material. The second cover layer 131 may be formed of a same material as that of the first cover layer 127. Accordingly, an interface formed in the pixel device 100 may be minimized, and thus, air gaps due to heat generated upon operating the device may be prevented. For example, the second cover layer 131 together with the first cover layer 127 may be formed of polyimide, and in this case, the connection layers 129*a*, 129*b*, 129*c*, and 129*d* may be surrounded with polyimide on lower, side, and upper surfaces, except for the pad regions.

The pixel device 100 may be mounted on the circuit board using the bonding material, such as solder, and the bonding material may bond the connection layers 129*a*, 129*b*, 129*c*, and 129*d* exposed to the openings 131*a*, 131*b*, 131*c*, and 131*d* of the second cover layer 131 and the pads on the circuit board.

According to the illustrated exemplary embodiment, the pixel device 100 does not include additional bumps, and the connection layers 129*a*, 129*b*, 129*c*, and 129*d* are used as bonding pads. However, the inventive concepts are not limited thereto, and in some exemplary embodiments, bonding pads covering the openings 131*a*, 131*b*, 131*c*, and 131*d* of the second cover layer 131 may be further formed. In an exemplary embodiment, the bonding pads may be formed to partially cover the light emitting devices 10R and 10GB beyond upper regions of the first through fourth connection layers 129*a*, 129*b*, 129*c*, and 129*d*.

Referring back to FIG. 2A, a length W1 of one side of the pixel device 100 may be 300 μm or less, and an area of the pixel device 100 may be 300 μm×300 μm or less. A length W2 of one side of each of the first light emitting device 10R and the second light emitting device 10GB may be 100 μm or less, and each area may be 100 μm×100 μm or less, 50 μm×50 μmm or less, and furthermore, 10 μm×10 μm or less. Meanwhile, a length W3 of one side of the opening of the second cover layer 131 may be 70 μm or less. In an exemplary embodiment, the sides of the pixel device 100, light emitting device, and opening of the second cover layer 131 may have a relationship of W1>W2>W3. By making the W3 the smallest, the length W1 of the pixel device 100 may be minimized. In addition, if the W2 is smaller than the W3, and when the pixel devices 100 are disposed adjacently, a distance between the first region of one pixel device and the second region of another pixel device adjacent thereto increases, so that it is difficult to increase a pixel density. As such, by making the W2 greater than the W3, the distance between adjacent pixel devices 100 may be reduced.

In the illustrated exemplary embodiment, although the light emitting devices 10R and 10GB are described as being attached to the transparent substrate 121 by the adhesive layer 125, the light emitting devices 10R and 10GB in other exemplary embodiments may be coupled to the transparent substrate 121 using another coupler instead of the adhesive layer 125. For example, the light emitting devices 10R and 10GB may be coupled to the transparent substrate 121 using spacers, and thus, gas or liquid may be filled in a region between the light emitting devices 10R and 10GB and the transparent substrate 121. An optical layer that transmits light emitted from the light emitting devices 10R and 10GB may be formed by this gas or liquid. The adhesive layer 125 described above is also an example of an optical layer. The optical layer may be formed of a material different from that of the light emitting devices 10R and 10GB, for example, gas, liquid, or solid, and thus, it is distinguished from materials of the semiconductor layers in the light emitting devices 10R and 10GB.

Meanwhile, in the illustrated exemplary embodiment, the first region and the second region are shown to have a square shape, but the inventive concepts are not limited to a particular shape of the first and second regions, and these regions may have a rectangular shape other than a square. In this case, long sides of the first region and the second region may be disposed parallel to face each other. When a plurality of light emitting structures is stacked in either the first region or the second region, each of the light emitting structures may have a different size, and preferably, a size of a light emitting structure disposed close to the transparent substrate 121 may be larger.

According to the illustrated exemplary embodiment, the pixel device 100 is provided in which the light emitting devices 10R and 10GB are arranged on a same plane. The pixel device 100 may implement light of various colors using the light emitting devices 10R and 10GB. Hereinafter, the light emitting devices 10R and 10GB according to an exemplary embodiment will be described in detail.

Figure 3A:
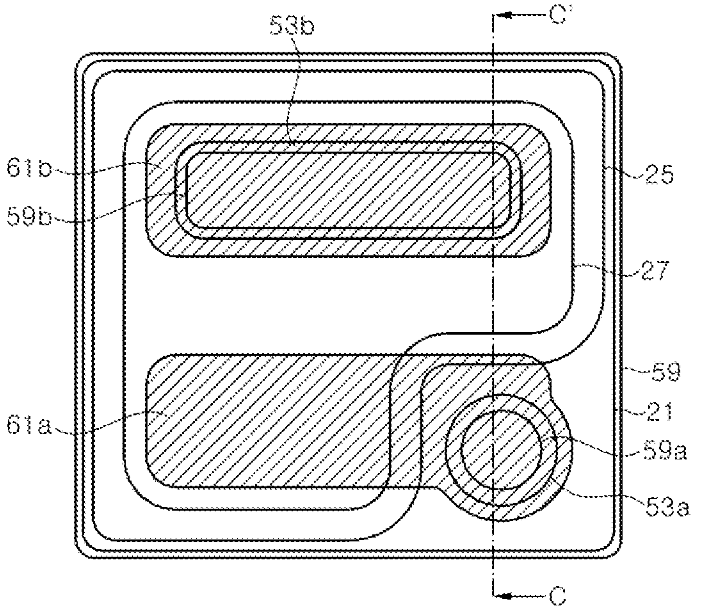
FIG. 3A is a schematic plan view illustrating a first light emitting device according to an exemplary embodiment.
Figure 3B:
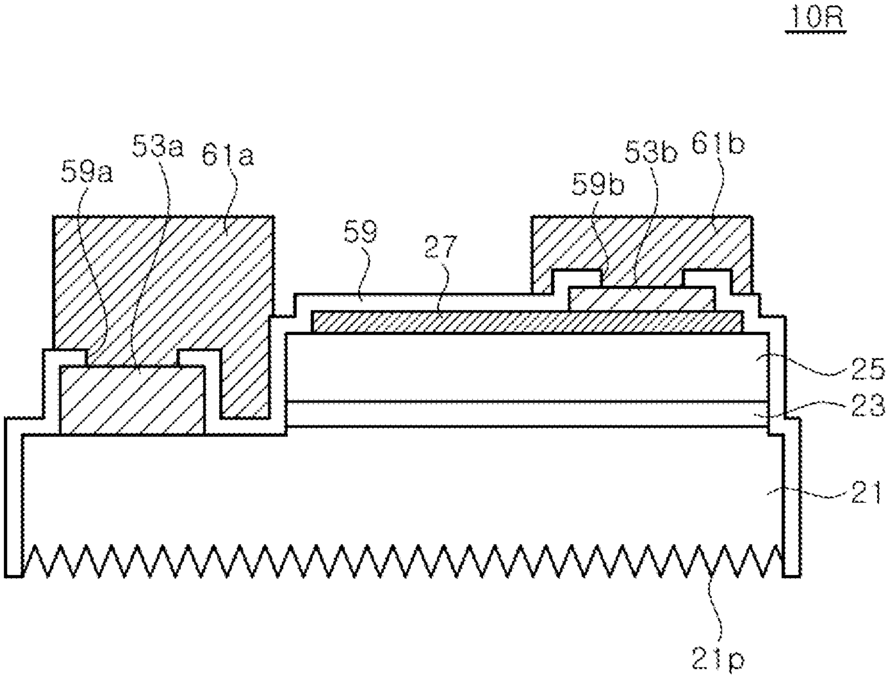
FIG. 3B is a schematic cross-sectional view taken along line C-C' in FIG. 3A.

FIG. 3A is a schematic plan view illustrating a first light emitting device 10R according to an exemplary embodiment, and FIG. 3B is a schematic cross-sectional view taken along line C-C' in FIG. 3A.

Referring to FIGS. 3A and 3B, the first light emitting device 10R may include a first light emitting structure including a first conductivity type semiconductor layer 21, an active layer 23, and a second conductivity type semiconductor layer 25, an ohmic contact layer 27, a first contact pad 53*a*, a second contact pad 53*b*, an insulation layer 59, a first electrode pad 61*a*, and a second electrode pad 61*b*.

The first light emitting structure, that is, the first conductivity type semiconductor layer 21, the active layer 23, and the second conductivity type semiconductor layer 25 may be grown on a substrate. The substrate may be one of various substrates that can be used to grow semiconductors, such as a gallium nitride substrate, a GaAs substrate, a Si substrate, a sapphire substrate, especially a patterned sapphire substrate. A growth substrate may be separated from the semiconductor layers using techniques such as mechanical polishing, laser lift-off, chemical lift-off, and others. The substrate may be, for example, a GaAs substrate, and may be removed from the first conductivity type semiconductor layer 21 using a chemical etching technique.

In an exemplary embodiment, the first light emitting structure may include an arsenic or phosphide-based semiconductor layer, such as aluminum gallium arsenide (AlGaAs), gallium arsenide phosphide (GaAsP), aluminum gallium indium phosphide (AlGaInP), or gallium phosphide (GaP), and may emit red light.

The first conductivity type and the second conductivity type have opposite polarities. For example, when the first conductivity type is an n-type, the second conductivity type is a p-type, and when the first conductivity type is the p-type, the second conductivity type becomes the n-type.

The first conductivity type semiconductor layer 21, the active layer 23, and the second conductivity type semiconductor layer 25 may be grown on the substrate in a chamber using a known method, such as metal organic chemical vapor deposition (MOCVD). In addition, the first conductivity type semiconductor layer 21 includes n-type impurities (e.g., Si, Ge, Sn), and the second conductivity type semiconductor layer 25 includes p-type impurities (e.g., Mg, Sr, Ba), or vice versa.

Although each of the first conductivity type semiconductor layer 21 and the second conductivity type semiconductor layer 25 is shown as a single layer in the drawing, these layers may be formed as multiple layers, or may include a superlattice layer. The active layer 23 may include a single quantum well structure or a multi-quantum well structure, and a composition ratio of the semiconductor is adjusted to emit light having a desired wavelength. For example, the active layer 23 may emit red light.

The second conductivity type semiconductor layer 25 and the active layer 23 may have a mesa structure and may be disposed on the first conductivity type semiconductor layer 21. The mesa includes the second conductivity type semiconductor layer 25 and the active layer 23, and may include a portion of the first conductivity type semiconductor layer 21 as shown in FIG. 3B. The mesa may be positioned on a partial region of the first conductivity type semiconductor layer 21, and an upper surface of the first conductivity type semiconductor layer 21 may be exposed around the mesa.

In the illustrated exemplary embodiment, the mesa is formed to expose the first conductivity type semiconductor layer 21 around it. In another exemplary embodiment, a through hole exposing the first conductivity type semiconductor layer 21 may be formed through the mesa.

Meanwhile, the first conductivity type semiconductor layer 21 may have a concavo-convex pattern 21*p* by surface texturing. The concavo-convex pattern 21*p* may be formed on a side of a light exiting surface of the first conductivity type semiconductor layer 21. The surface texturing may be performed, for example, by patterning using a dry or wet etching process.

In an exemplary embodiment, cone-shaped protrusions may be formed, in which a height of a cone may be 2 μm to 3 μm, a cone interval may be 1.5 μm to 2 μm, and a bottom diameter of the cone may be about 3 μm to 5 μm. The cone may also be truncated, in which case an upper diameter of the cone may be about 2 μm to 3 μm.

In another exemplary embodiment, the concavo-convex pattern 21*p* may include a first concavo-convex pattern and a second concavo-convex pattern additionally formed on the first concavo-convex pattern. The second concavo-convex pattern may be formed in a size smaller than that of the first concavo-convex pattern. By forming the concavo-convex pattern 21*p* on the surface of the first conductivity type semiconductor layer 21, a total internal reflection may be reduced and a light extraction efficiency may be increased.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide layer or a metallic layer. Examples of the transparent conductive oxide may include ITO, ZnO, or the like, and examples of the metallic layer may include metal, such as Al, Ti, Cr, Ni, Au, or an alloy thereof.

The first contact pad 53*a* is disposed on the exposed first conductivity type semiconductor layer 21. The first contact pad 53*a* may be in ohmic contact with the first conductivity type semiconductor layer 21. For example, the first contact pad 53*a* may be formed of an ohmic metal layer in ohmic contact with the first conductivity type semiconductor layer 21. The ohmic metal layer of the first contact pad 53*a* may be appropriately selected according to a semiconductor material of the first conductivity type semiconductor layer 21. In some exemplary embodiments, the first contact pad 53*a* may be omitted.

The second contact pad 53*b* may be disposed on the ohmic contact layer 27. The second contact pad 53*b* is electrically connected to the ohmic contact layer 27. In some exemplary embodiments, the second contact pad 53*b* may be omitted.

The insulation layer 59 covers the mesa, the ohmic contact layer 27, the first contact pad 53*a*, and the second contact pad 53*b*. The insulation layer 59 has openings 59*a* and 59*b* exposing the first contact pad 53*a* and the second contact pad 53*b*. The insulation layer 59 may be formed as a single layer or multiple layers. Furthermore, the insulation layer 59 may include a distributed Bragg reflector in which insulation layers having different refractive indices are stacked. For example, the distributed Bragg reflector may include at least two insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range, including a peak wavelength of light emitted from the active layer 23, and may be designed considering an incident angle of light. In an exemplary embodiment, the distributed Bragg reflector may have a higher reflectance for light incident at an incident angle of 0 than that of light incident at other incident angles. In another exemplary embodiment, the distributed Bragg reflector may have a higher reflectance for light incident at another specific incident angle than that of light incident at an incident angle of 0 degrees. For example, the distributed Bragg reflector may have a higher reflectance for light incident at an incident angle of 10 degrees compared to that of light incident at an incident angle of 0 degrees.

The first electrode pad 61*a* and the second electrode pad 61*b* are disposed on the insulation layer 59. The first electrode pad 61*a* may extend from an upper portion of the first contact pad 53*a* to an upper portion of the mesa, and the second electrode pad 61*b* may be disposed in the upper region of the mesa. The first electrode pad 61*a* may be connected to the first contact pad 53*a* through the opening 59*a*, and the second electrode pad 61*b* may be electrically connected to the second contact pad 53*b*. In some exemplary embodiments, the first electrode pad 61*a* may be directly in ohmic contact with the first conductivity type semiconductor layer 21, and in this case, the first contact pad 53*a* may be omitted. In addition, when the second contact pad 53*b* is omitted, the second electrode pad 61*b* may be directly connected to the ohmic contact layer 27.

The first and/or second electrode pads 61*a* and 61*b* may be formed of a single-layer or multi-layer metal. Metal, such as Al, Ti, Cr, Ni, Au, or an alloy thereof, may be used as materials for the first and/or second electrode pads 61*a* and 61*b*.

Although the light emitting device 10R according to an exemplary embodiment has been briefly described with drawings, the light emitting device 10R may further include layers having additional functions in addition to the above-described layers. For example, various layers, such as a reflection layer that reflects light, an additional insulation layer for insulating a specific component, and a solder prevention layer that prevents solder from spreading may be further included in the light emitting device 10R.

In addition, in forming a flip chip type light emitting device, a mesa may be formed to have various shapes, and positions or shapes of the first and second electrode pads 61*a* and 61*b* may also be variously changed. In addition, in other exemplary embodiments, the ohmic contact layer 27 may be omitted, and the second contact pad 53*b* or the second electrode pad 61*b* may directly contact the second conductivity type semiconductor layer 25.

In the illustrated exemplary embodiment, the first light emitting device 10R has a flip chip structure, but the inventive concepts are not limited thereto, and the first light emitting device 10R may have a lateral structure in other exemplary embodiments.

Figure 4A:
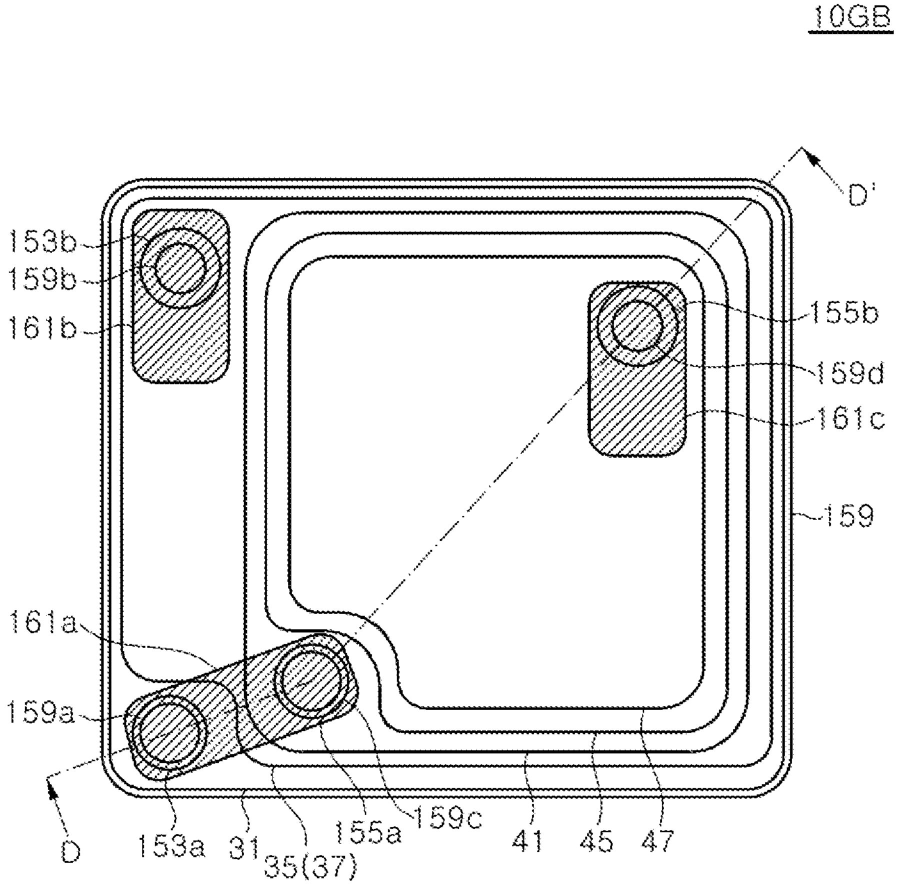
FIG. 4A is a schematic plan view illustrating a second light emitting device according to an exemplary embodiment.
Figure 4B:
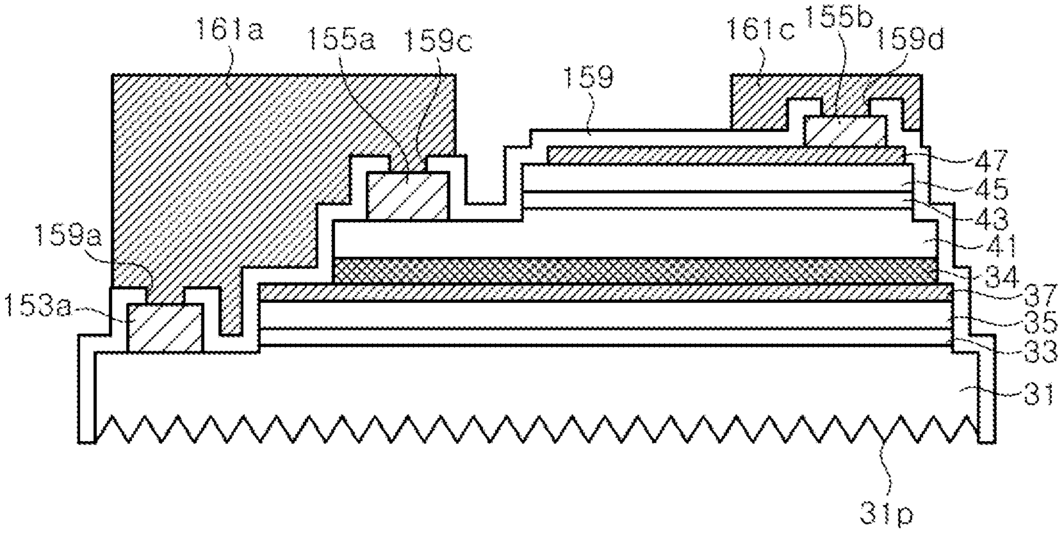
FIG. 4B is a schematic cross-sectional view taken along line D-D' in FIG. 4A.

FIG. 4A is a schematic plan view illustrating a second light emitting device 10GB according to an exemplary embodiment, and FIG. 4B is a schematic cross-sectional view taken along line D-D' in FIG. 4A.

Referring to FIGS. 4A and 4B, the second light emitting device 10GB includes a second light emitting structure including a first conductivity type semiconductor layer 31, an active layer 33, and a second conductivity type semiconductor layer 35, and a third light emitting structure including a first conductivity type semiconductor layer 41, an active layer 43, and a second conductivity type semiconductor layer 45. The second light emitting device 10GB may include ohmic contact layers 37 and 47, first contact pads 153*a* and 155*a*, second contact pads 153*b* and 155*b*, electrode pads 161*a*, 161*b*, and 161*c*, an adhesive layer 34, and an insulation layer 159.

Light generated in the active layer 33 of the second light emitting structure and the active layer 43 of the third light emitting structure is emitted to the outside through the first conductivity type semiconductor layer 31 of the second light emitting structure. In general, the active layer 43 of the third light emitting structure may emit light having a peak wavelength longer than that emitted from the active layer 33 of the second light emitting structure. For example, the third light emitting structure may emit green light, and the second light emitting structure may emit blue light. However, in some exemplary embodiments, the second light emitting structure may emit light having a wavelength longer than that emitted from the third light emitting structure to adjust a relative intensity of light emitted from the second light emitting structure and the third light emitting structure. For example, the second light emitting structure may emit green light, and the third light emitting structure may emit blue light. Accordingly, an intensity of light emitted from the third light emitting structure may be decreased, and an intensity of light emitted from the second light emitting structure may be increased.

The semiconductor layers in the second and third light emitting structures may be selected to emit light of a desired peak wavelength. The first conductivity type semiconductor layers 31 and 41 and the second conductivity type semiconductor layers 350 and 45 may be formed as a single layer or multiple layers, and the active layers 33 and 43 may have a single quantum well structure or a multi-quantum well structure. In a case of the light emitting structure emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP), and in a case of the light emitting structure emitting blue light, the semiconductor layers may include gallium nitride (GaN), indium gallium nitride (InGaN), or zinc selenide (ZnSe). According to an exemplary embodiment, the second and third light emitting structures may include a nitride-based semiconductor layer.

The ohmic contact layer 37 is disposed on the second conductivity type semiconductor layer 35 to be in ohmic contact with the second conductivity type semiconductor layer 35. The ohmic contact layer 37 may be formed of a single layer or multiple layers, and may be formed of a transparent conductive oxide layer or a metallic layer. Examples of the transparent conductive oxide may include ITO, ZnO, or the like, and examples of the metallic layer may include metal, such as Al, Ti, Cr, Ni, Au, or an alloy thereof. The ohmic contact layer 37 may be formed of a light transmissive material to transmit light generated from the third light emitting structure.

The ohmic contact layer 47 is disposed on the second conductivity type semiconductor layer 45 to be in ohmic contact with the second conductivity type semiconductor layer 45. The ohmic contact layer 47 may be formed of a single layer or multiple layers, and may be formed of a transparent conductive oxide layer or a metallic layer. Examples of the transparent conductive oxide may include ITO, ZnO, or the like, and examples of the metallic layer may include metals such as Al, Ti, Cr, Ni, Au, and alloys thereof.

The adhesive layer 34 may couple the second light emitting structure and the third light emitting structure. The adhesive layer 34 may include optically clear adhesives (OCA), such as epoxy, polyimide, SUB, spin-on-glass (SOG), benzocyclobutene (BCB), without being limited thereto.

The first contact pads 153*a* and 155*a* are disposed on the first conductivity type semiconductor layers 31 and 41, respectively, and may be in ohmic contact therewith. A partial region of the first conductivity type semiconductor layer 31 may be exposed, and the first contact pad 153*a* may be formed on the exposed first conductivity type semiconductor layer 31. In addition, a partial region of the first conductivity type semiconductor layer 41 may be exposed, and the first contact pad 155*a* may be formed on the exposed first conductivity type semiconductor layer 41.

Meanwhile, the second contact pads 153*b* and 155*b* are electrically connected to the second conductivity type semiconductor layers 35 and 45, respectively. The second contact pads 153*b* and 155*b* may be formed on the ohmic contact layers 37 and 47, respectively.

The insulation layer 159 may cover the second light emitting structure and the third light emitting structure, and may cover the ohmic contact layers 37 and 47, the first contact pads 153*a* and 155*a*, and the second contact pads 153*b* and 155*b*. The insulation layer 159 may also cover a side surface of the first conductivity type semiconductor layer 31. The insulation layer 159 may have openings 159*a*, 159*b*, 159*c*, and 159*d* exposing the first contact pads 153*a* and 155*a* and the second contact pads 153*b* and 155*b* to allow electrical connection thereto.

The electrode pads 161*a*, 161*b*, and 161*c* are formed on the insulation layer 159, and may be electrically connected to the first contact pads 153*a* and 155*a* and the second contact pads 153*b* and 155*b*. The electrode pad 161*a* may electrically connect the first contact pad 153*a* and the first contact pad 155*a*. Accordingly, the first conductivity type semiconductor layer 31 and the first conductivity type semiconductor layer 41 may be electrically connected to each other. The electrode pad 161*b* may be electrically connected to the second contact pad 153*b*, and the electrode pad 161*c* may be electrically connected to the second contact pad 155*b*. The electrode pads 161*a*, 161*b*, and 161*c* are electrically spaced apart from one another. Meanwhile, as shown in FIG. 2A, a fourth connection layer 129*d* may be connected to the electrode pad 161*a* to be commonly electrically connected to the first conductivity type semiconductor layers 31 and 41 of the second light emitting device 10GB.

In the illustrated exemplary embodiment, the third light emitting structure may have an area smaller than that of the second light emitting structure. However, the inventive concepts are not limited thereto. For example, in some exemplary embodiments, electrical connection may be achieved through contact holes exposing the first conductivity type semiconductor layer 31, the ohmic contact layer 37, and the first conductivity type semiconductor layer 41, and in this case, outer areas of the second light emitting structure and the third light emitting structure may be the same.

The second light emitting device 10GB may be formed at a wafer level using a wafer bonding technique. After the first conductivity type semiconductor layer 31 is separated from a growth substrate, a concavo-convex 31*p* may be formed on an exposed surface, and viewing angles of light emitted from the second light emitting structure and the third light emitting structure may be adjusted by using the concavo-convex 31*p*. Furthermore, a light extraction efficiency may be improved by using light scattering by the concavo-convex 31*p*.

According to the illustrated exemplary embodiment, a luminous intensity of red light may be improved by disposing the first light emitting device 10R emitting red light independently of the second light emitting device 10GB emitting green and blue light. Furthermore, by disposing the second light emitting device 10GB having a structure in which the second light emitting structure and the third light emitting structure are stacked, the pixel device 100 may be miniaturized, and a mounting process of the light emitting devices may be further simplified.

As shown in FIG. 1, the pixel device 100 is disposed on a circuit board 1001 and mounted on the panel substrate 2100. A plurality of pixel devices 100 is disposed on the circuit board 1001 to form the light emitting module 1000. Since the light emitting module 1000 is formed and pixels are disposed on the panel substrate 2100, the light emitting module 1000 may be repaired or replaced after checking a defective pixel in each light emitting module 1000. Since individual light emitting module may be replaced or repaired, it is not necessary to repair or discard the entire display apparatus, and thus, cost loss due to an occurrence of defects may be reduced.

Although the light emitting module 1000 has been described as being mounted on the panel substrate 2100 in the illustrated exemplary embodiment, in other exemplary embodiments, the light emitting modules 1000 may be mounted in a cabinet, and a plurality of cabinets in which the light emitting modules 1000 are mounted may be mounted on the panel substrate 2100.

Figure 5:
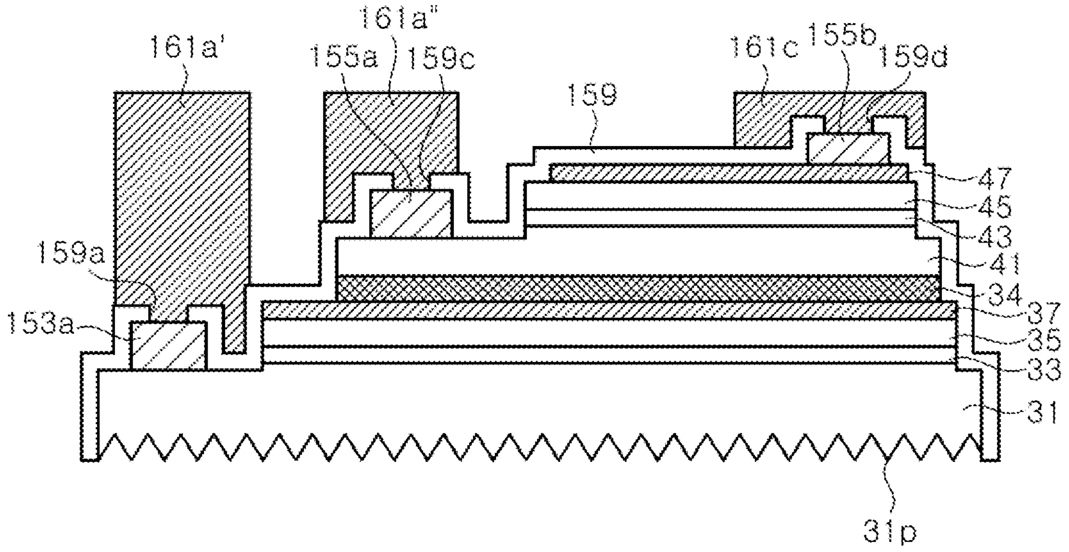
FIG. 5 is a schematic cross-sectional view illustrating a second light emitting device according to another embodiment.
Figure 6:
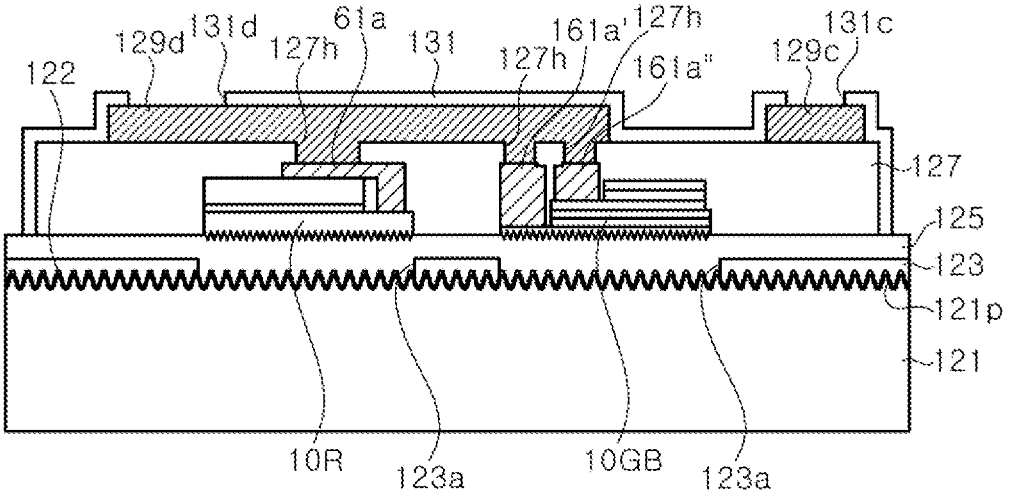
FIG. 6 is a schematic cross-sectional view illustrating a pixel device according to another exemplary embodiment.

FIG. 5 is a schematic cross-sectional view illustrating a second light emitting device according to another exemplary embodiment, and FIG. 6 is a schematic cross-sectional view illustrating a pixel device according to another exemplary embodiment.

Referring to FIG. 5, the second light emitting device according to an exemplary embodiment is substantially similar to the second light emitting device 10GB described with reference to FIGS. 4A and 4B, except that electrode pads 161a' and 161a" are provided on first contact pads 153a and 155a, respectively. Since the electrode pads 161a' and 161a" are provided on the first contact pads 153a and 155a, respectively, there is no need to dispose the first contact pads 153a and 155a adjacent to each other, and thus, a process margins may be increased.

As shown in FIG. 6, a connection layer 129d may be electrically connected to both of the electrode pads 161a' and 161a" through openings 127h of a first cover layer 127. Accordingly, the electrode pads 161a' and 161a" may be electrically connected to each other, and thus, first conductivity type semiconductor layers 31 and 41 are electrically connected to each other.

Figure 7:
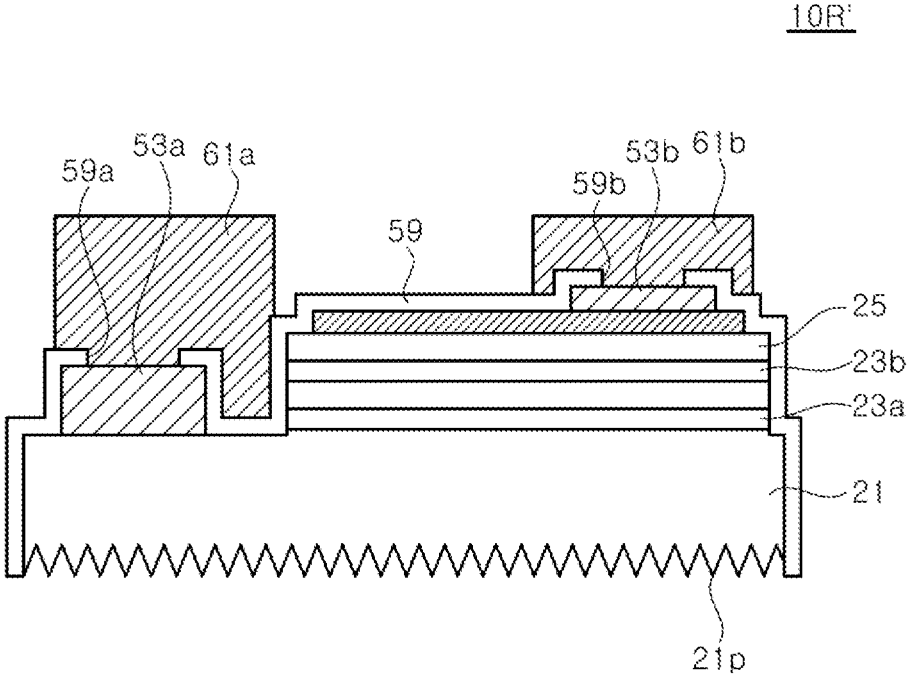
FIG. 7 is a schematic cross-sectional view illustrating a first light emitting device according to another embodiment.
Figure 8:
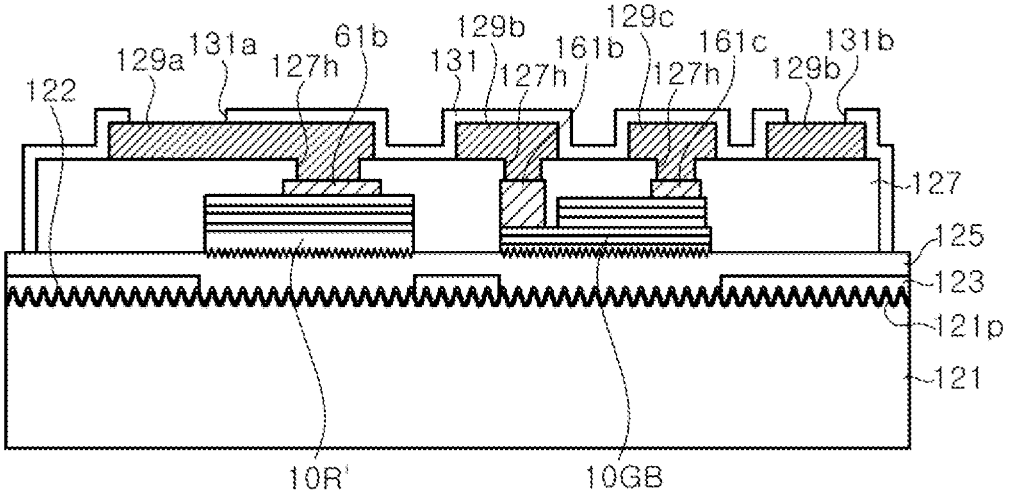
FIG. 8 is a schematic cross-sectional view illustrating a pixel device according to another exemplary embodiment.

FIG. 7 is a schematic cross-sectional view illustrating a first light emitting device 10R' according to another exemplary embodiment, and FIG. 8 is a schematic cross-sectional view illustrating a pixel device according to another exemplary embodiment.

Referring to FIG. 7, the first light emitting device 10R1 according to an exemplary embodiment is substantially similar to the first light emitting device 10R described with reference to FIGS. 3A and 3B, except that a plurality of active layers 23a and 23b is included. More particularly, the first light emitting device 10R1 may include a first light emitting structure including the active layer 23a and a sub-light emitting structure including the active layer 23b. The active layer 23b of the sub-light emitting structure may also emit light having a wavelength longer than a peak wavelength of light emitted from a second light emitting structure and a third light emitting structure. The active layers 23a and 23b may be formed of a semiconductor material as that described with reference to FIGS. 3A and 3B. The first light emitting structure and the sub-light emitting structure may be coupled to each other through a tunnel layer, and may be operated together. Accordingly, for example, when the active layers 23a and 23b emit light having a same or similar peak wavelengths, an intensity of light emitted from the first light emitting device 10R' may be increased. As shown in FIG. 8, the first light emitting device 10R' may be mounted on a pixel device instead of the first light emitting device 10R. A connection layer 129a may be electrically connected to a second conductivity type semiconductor layer 25 of the sub-light emitting structure, and a first conductivity type semiconductor layer 21 may be electrically connected to the connection layer 129d as shown in FIG. 2C.

Figure 9:
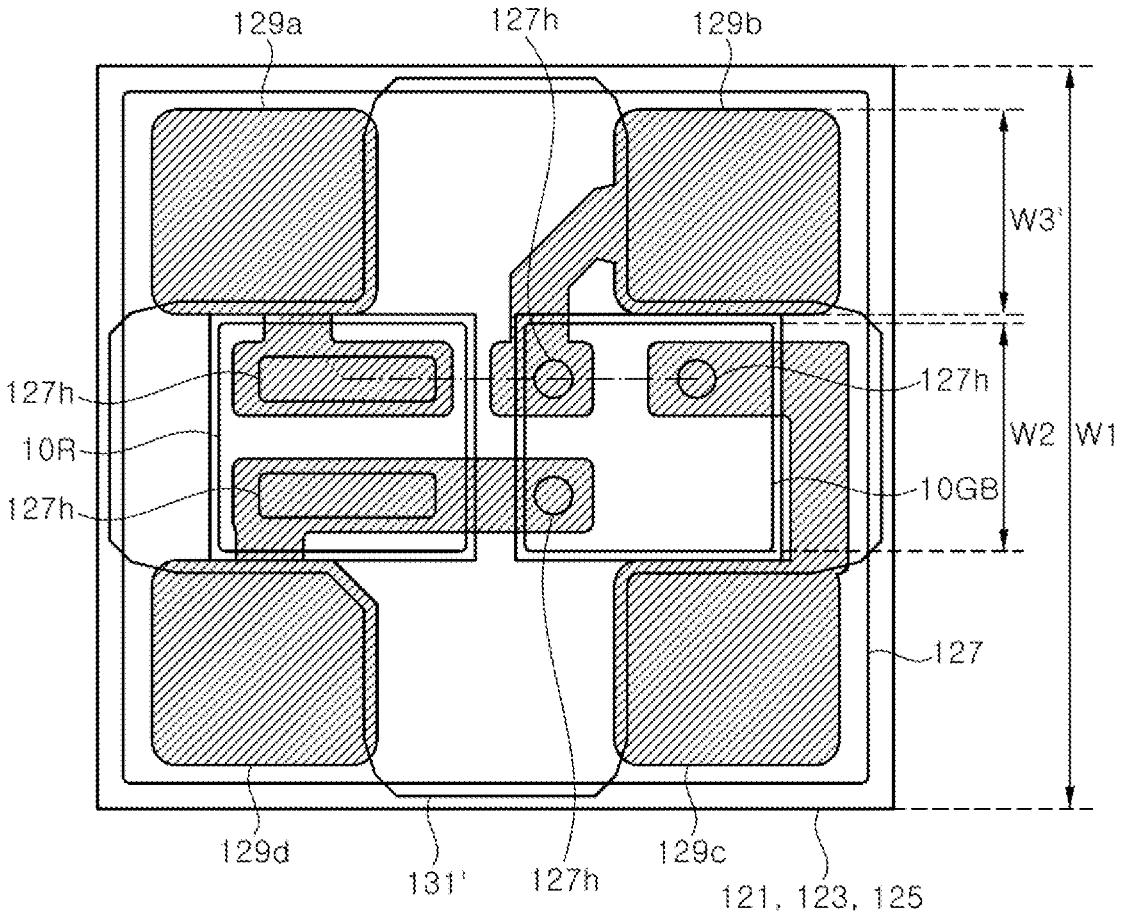
FIG. 9 is a schematic plan view illustrating a pixel device according to another exemplary embodiment.

FIG. 9 is a schematic plan view illustrating a pixel device according to another exemplary embodiment.

Referring to FIG. 9, the pixel device according to an exemplary embodiment is substantially similar to the pixel device 100 described with reference to FIGS. 2A, 2B, and 2C, except that a second cover layer 131' partially covers a first cover layer 127 and connection layers 129a, 129b, 129c, and 129d. As shown in FIG. 9, the second cover layer 131' covers a central region of the pixel device in a transverse direction and a longitudinal direction while exposing corner regions. In particular, the second cover layer 131' does not cover connection layer regions adjacent to edges of the pixel device. Accordingly, an area exposed to the outside of upper surfaces of the connection layers, that is, an area of pad regions may be further increased. More particularly, a length W3' of the pad regions may be greater than the length W3 of the pad region in the pixel device shown in FIG. 2A. Accordingly, it is possible to secure a sufficient pad region while miniaturizing the pixel device.

Figure 10A:
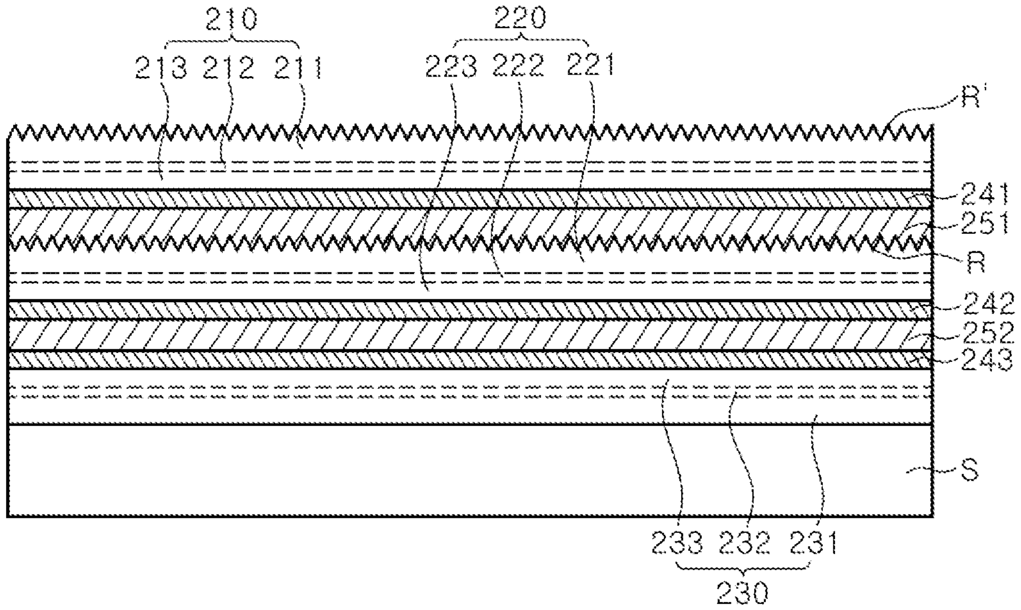
FIG. 10A is a schematic cross-sectional view illustrating a stacked semiconductor layer according to an exemplary embodiment.
Figure 10B:
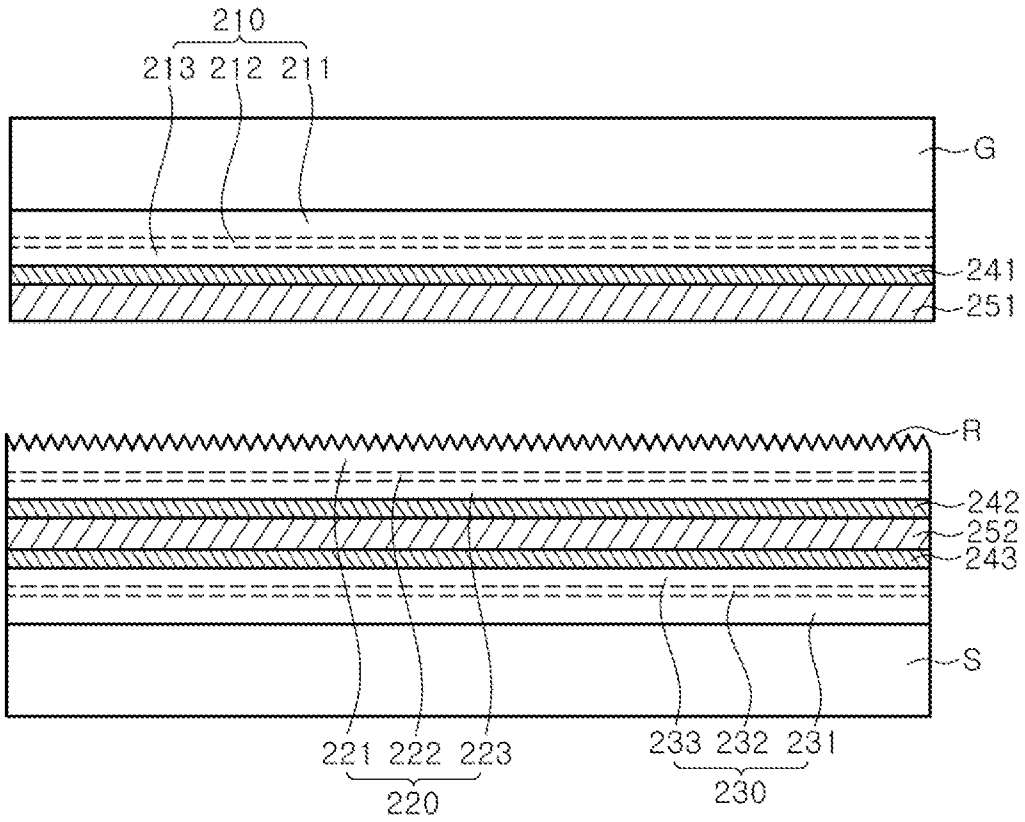
FIG. 10B is a view showing a step prior to forming the stacked semiconductor layer of FIG. 10A as a stacked semiconductor layer according to an exemplary embodiment.

FIG. 10A is a view showing a light emitting device disposed on a first substrate S. Referring to FIG. 10A, the light emitting device according to an exemplary embodiment includes a first light emitting stack 210, a second light emitting stack 220 disposed under the first light emitting stack 210, and a third light emitting stack 230 disposed under the second light emitting stack 220. The first light emitting stack 210 includes a first conductivity type semiconductor layer 211, an active layer 212, and a second conductivity type semiconductor layer 213. The second light emitting stack 220 includes a first conductivity type semiconductor layer 221, an active layer 222, and a second conductivity type semiconductor layer 223. In addition, the third light emitting stack 230 includes a first conductivity type semiconductor layer 231, an active layer 232, and a second conductivity type semiconductor layer 233, the active layers 212, 222, and 232 of each of the light emitting stacks 210, 220, and 230 emit light having different peak wavelengths from one another. For example, through performing a process of bonding the light emitting stacks formed on each wafer in a stacked type, and isolating them into individual chips at once, a process time may be shortened by making individual cutting processes for each of the light emitting stacks into one process.

The first light emitting stack 210 may emit light having a longest peak wavelength. For example, the first light emitting stack 210 may emit red light. At least one of materials, such as InGaN, InAlGaN, GaN, AlGaN, AlGaAs, GaAsP, AlGaInP, and GaP, may be included. However, the inventive concepts are not limited to these materials, and any material capable of emitting red light can be included in the first light emitting stack 210.

The second light emitting stack 220 may emit light having a peak wavelength shorter than that of the first light emitting stack 210. For example, the second light emitting stack 220 may emit green light. The second light emitting stack 220 may include at least one of materials, such as GaN, InGaN, AlGaN, InGaN, GaP, AlGaInP, and AlGaP, without being limited thereto.

The third light emitting stack 230 may emit light having a shortest peak wavelength. The third light emitting stack 230 may emit blue light. For example, the third light emitting stack 230 may include a semiconductor material emitting blue light, such as GaN, InGaN, or ZnSe, without being limited thereto. In addition, a color of light emitted from each of the stacked semiconductor layers is not limited thereto, and various semiconductor layers may be combined and stacked.

The third light emitting stack 230 is disposed over the first substrate S, the first substrate S is a substrate capable of epitaxially growing the third light emitting stack 230, for example, a semiconductor layer emitting blue light, and may be, for example, a sapphire substrate. However, the inventive concepts are not limited thereto, and the first substrate S may include various other transparent insulation materials in other exemplary embodiments. For example, the first substrate S may include glass, quartz, silicon, an organic polymer, or an organic-inorganic composite material, and for example, it may be one of silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate.

In addition, although not shown in the drawings, the first substrate S may include a concavo-convex surface, and may be, for example, a patterned sapphire substrate. An extraction efficiency of light generated from the third light emitting stack 230 in contact with the first substrate S may be increased by including a concavo-convex portion on an upper surface thereof. In another exemplary embodiment, the first substrate S may be removed.

Figure 11A:
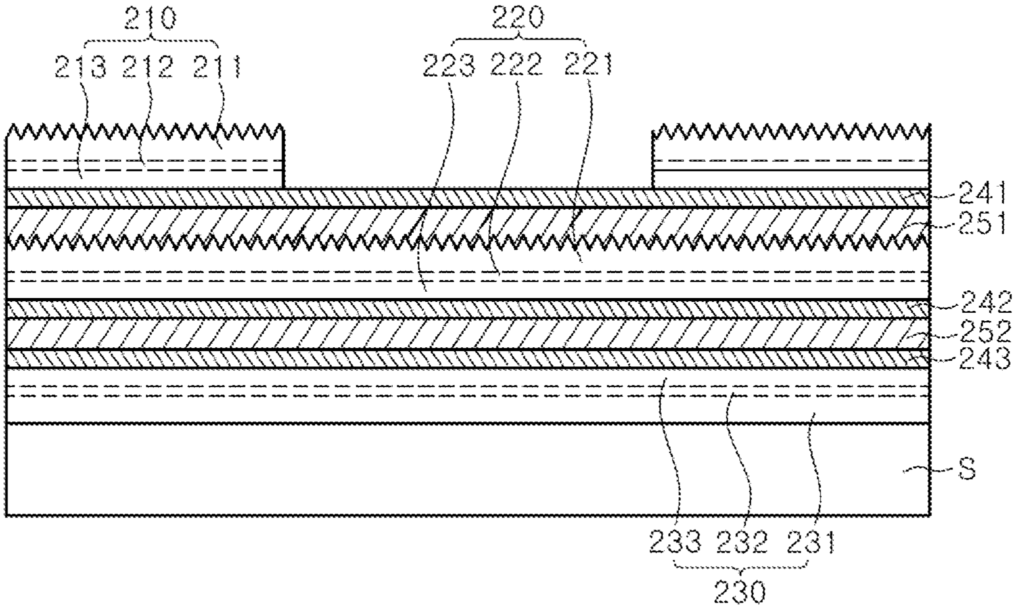
FIG. 11A is a schematic cross-sectional view illustrating a method of manufacturing a first light emitting stack of a stacked semiconductor layer according to an exemplary embodiment.
Figure 11B:
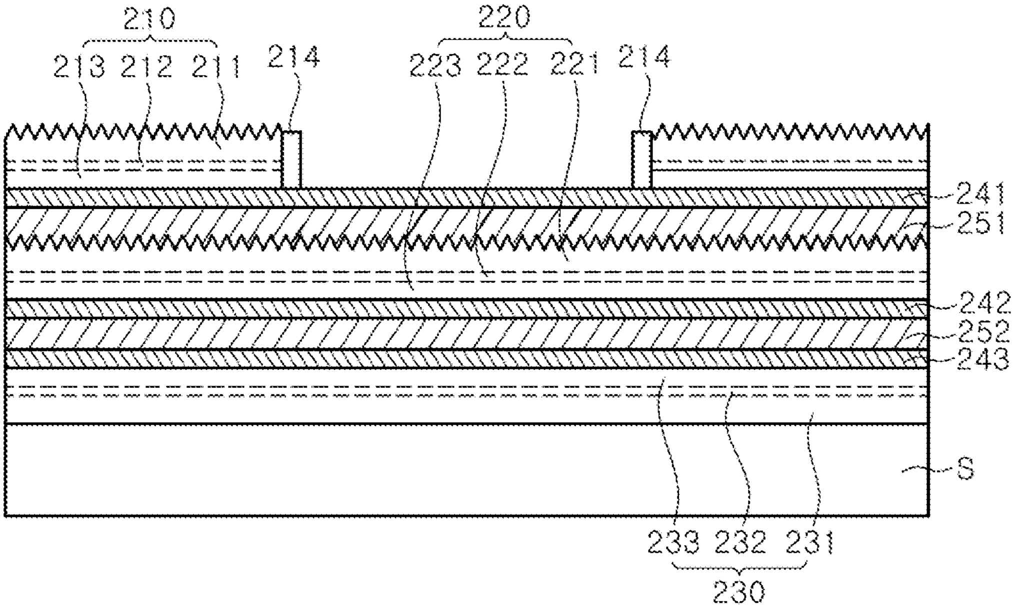
FIG. 11B is a schematic cross-sectional view illustrating a method of manufacturing a first light emitting stack of a stacked semiconductor layer according to an exemplary embodiment.

FIG. 11B is a view showing the first light emitting stack 210 before being bonded to the second light emitting stack 220 and the third light emitting stack 230. According to an exemplary embodiment, the first light emitting stack 210 may emit light having a longest wavelength among a plurality of light emitting stacks, and may be, for example, a semiconductor layer emitting red light. Accordingly, a second substrate G may be a growth substrate formed of a material different from that of the first substrate S. For example, the second substrate G may be GaAs. However, the inventive concepts are not limited thereto.

In addition, lower contact layers 242 and 243 may be disposed on the second conductivity type semiconductor layers 223 and 233 of the second light emitting stack 220 and the third light emitting stack 230, respectively, before the second and third light emitting stacks 220 and 230 are bonded to each other. A second adhesive layer 252 may be disposed between the lower contact layers 242 and 243 to bond the second light emitting stack 220 and the third light emitting stack 230. The second adhesive layer 252 may include a non-conductive material transmitting light. For example, the second adhesive layer 252 may include optically clear adhesive (OCA), and more specifically, may include epoxy, polyimide, SUB, spin-on, glass (SOG), and benzocyclobutene (BCB), without being limited thereto.

In addition, although not shown in the drawings, an adhesion enhancement layer may be further included between the second light emitting stack 220 and the second adhesive layer 252. For example, the adhesion enhancement layer may be disposed between the second adhesive layer 252 and the second lower contact layer 242 to adhere them. The adhesion enhancement layer may prevent the second light emitting stack 220 from being peeled off from the second adhesive layer 252 in a process involving rapid stress change, such as a laser lift-off process, and may further prevent the second light emitting stack 220 from being cracked. The adhesion enhancement layer may be formed of, for example, a silicon oxide layer, without being limited thereto.

Furthermore, for similar reasons described above, between the second adhesive layer 252 and the third light emitting stack 230, more specifically, between the second adhesive layer 252 and the third lower contact layer 243, an adhesion enhancement layer may be additionally included. In addition, the adhesion enhancement layer may have a thickness smaller than those of the second and third lower contact layers 242 and 243, for example, about 100 nm.

In addition, a roughness R may be formed on the first conductivity type semiconductor layer 21 of the second light emitting stack 220. A shape and a size of the roughness R may be formed in various ways, which may be patterned in various ways to have various shapes, for example, wave type, embossing type, zigzag type, or others. By forming the roughness R over the first conductivity type semiconductor layer 221, light that would not otherwise be emitted to the outside due to a total reflection and reflected back to the inside may be reduced. Accordingly, light may be efficiently extracted from the inside of the semiconductor layer to the outside, thereby improving a luminous efficiency. However, in some exemplary embodiments, the roughness R may be omitted and a flat surface may be formed.

A growth substrate G, that is, the second substrate G, of the first light emitting stack 10 is removed, and a first adhesive layer 251 substantially the same as the second adhesive layer 252 is formed under the first lower contact layer 241 of the first light emitting stack 220, so that the first light emitting stack 210 may be bonded to the second and third light emitting stacks 220 and 230. As the second substrate G is removed, the first conductivity type semiconductor layer 211 of the first light emitting stack 210 disposed under the second substrate G may be exposed. A roughness R' may also be formed on the exposed first conductivity type semiconductor layer 211 as shown in FIG. 10A. A shape and a size of the roughness R' may be formed in various ways, which may be patterned in various ways to have various shapes, for example, wave type, embossing type, zigzag type, or others, and it may have a regular shape, or may have an irregular shape.

Referring back to FIG. 10A, by forming the roughness R' and R on the first conductivity type semiconductor layer 211 of the first light emitting stack 210 and on the first conductivity type semiconductor layer 221 of the second light emitting stack 220, respectively, it is possible to reduce the amount of light that would otherwise be totally reflected and re-enters the inside of the semiconductor layer during operation. Accordingly, a light efficiency may be improved by setting light to be efficiently emitted from the inside of the semiconductor layer to the outside.

Referring to FIG. 11A, a portion of the first light emitting stack 210 may be removed through an etching process or the like. As the portion of the first light emitting stack 210 is removed, a portion of the first lower contact layer 241 disposed under the removed portion of the first light emitting stack 210 may be exposed. In some exemplary embodiments, in addition to the first light emitting stack 210, a portion of the first lower contact layer 241 may also be removed, or the first adhesive layer 251 disposed under the first lower contact layer 241 may further be removed. The partial region of the first light emitting stack 210 that is removed may be a central region of the first light emitting stack 210, without being necessarily limited thereto, and the partial region of the first light emitting stack 210 may be removed to be skewed to one side to adjust a viewing angle or to adjust a light emitting intensity.

In addition, although not shown in the drawings, a roughness may be formed on an exposed surface of the first lower contact layer 241. A shape and a size of the roughness may be formed in various ways, which may be patterned in various ways to have various shapes, for example, wave type, embossing type, zigzag type, or others, and it may have a regular shape, or may have an irregular shape. By forming the roughness on the surface, light may be efficiently extracted, thereby improving the light efficiency.

The first lower contact layer 241 may include a transparent conductive material transmitting light. Lower contact layers may be disposed on surfaces of the first, second, and third light emitting stacks 210, 220, and 230, and, for example, the first, second, and third lower contact layers 241, 242, and 243 may include a transparent conductive oxide (ITO), such as SnO, $InO_2$, ZnO, ITO, ITZO, or the like, without being limited thereto. In some exemplary embodiments, the lower contact layer may be omitted. In addition, the first lower contact layer 241 may be thinner than the second and third lower contact layers 242 and 243. For example, the first lower contact layer 241 may be formed to have a thickness of about 240 nm, and the second and third lower contact layers 242 and 243 may be formed to have a thickness of about 300 nm. In addition, each of the lower contact layers may selectively form the roughness to improve the light extraction efficiency.

Referring to FIG. 11B, a reflection layer 214 including an insulation material and a light reflection material may be included in at least a portion of a side surface of the first light emitting stack 210. For example, the reflection layer 214 may include various organic or inorganic insulation materials, such as $SiO_2$, $SiN_x$, $Al_2O_3$, $TiO_2$, and the like, and may include a distributed Bragg reflector (DBR). For example, the reflection layer 214 may have a single-layer structure or a multi-layer structure formed of two or more insulation layers having different refractive indices from each other. The material of the reflection layer 214 is not limited thereto, and any material capable of reflecting light and having insulation characteristics may be used. In particular, the reflection layer 214 may include a material that may increase a luminous efficiency by allowing light to be extracted in a light emitting direction, that is, in an upward direction, without being dispersed in a lateral direction, by reflecting light laterally emitted from the first light emitting stack 210.

In addition, although not shown in the drawings, the side surface of the first light emitting stack 210 may have a slop inclined at a predetermined angle. By forming the side surface of the first light emitting stack 210 on which the reflection layer 214 is applied to be inclined, cracks or the like may be prevented when the reflection layer 214 is deposited, and reliability and efficiency of product characteristics may be improved.

Figure 12:
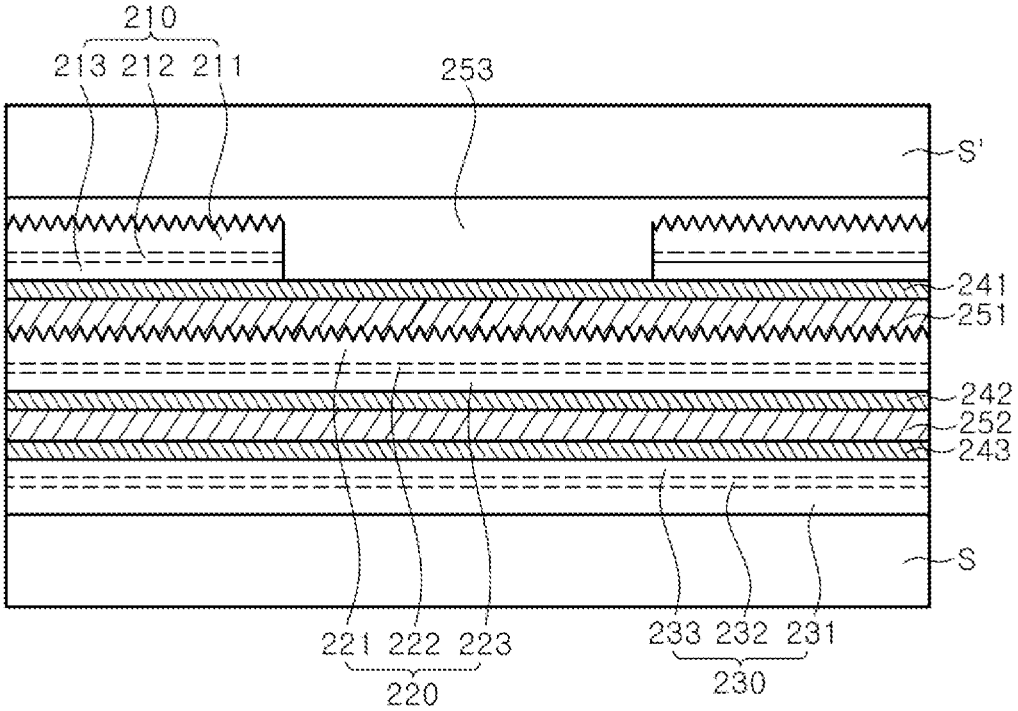
FIG. 12 is a schematic cross-sectional view illustrating a method of manufacturing a first light emitting stack and a substrate of a stacked semiconductor layer according to an exemplary embodiment.
Figure 13:
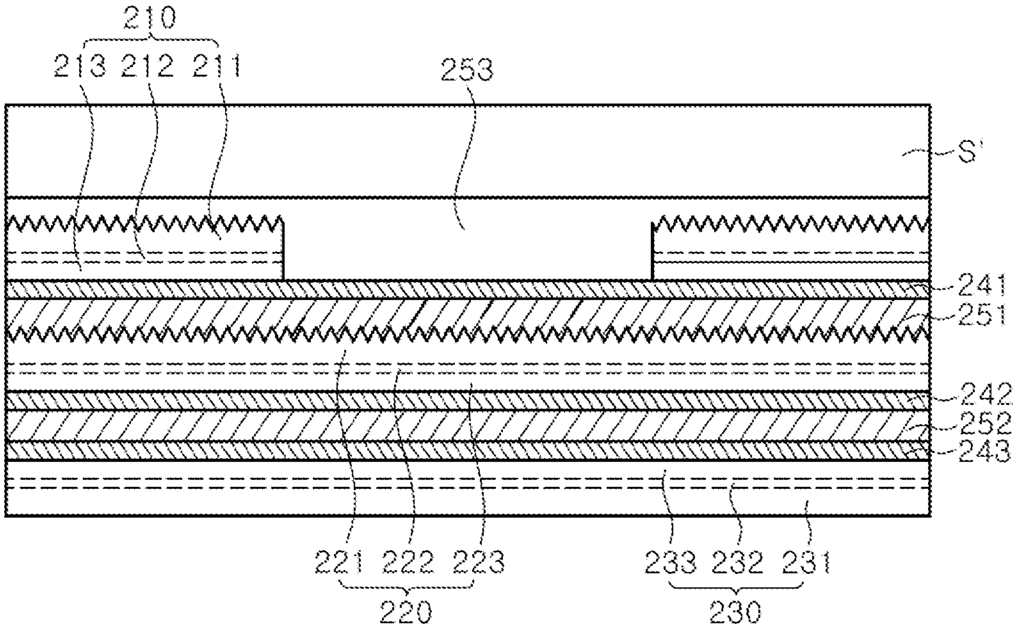
FIG. 13 is another schematic cross-sectional view illustrating a method of manufacturing a first light emitting stack and a substrate of a stacked semiconductor layer according to an exemplary embodiment.

Referring to FIGS. 12 and 13, a third adhesive layer 253 may be disposed to fill a space formed when the portion of the first light emitting stack 210 is removed, that is, a space over the second light emitting stack 220 and the third light emitting stack 230, and to cover the side surfaces of the first light emitting stack 210 and an upper portion of the first light emitting stack 210. In addition, the third adhesive layer 253 enables a third substrate S' to be adhered to the upper portion of the first light emitting stack 210, so that the third substrate S' may be disposed on an uppermost portion of the direction in which light is emitted. In addition, the first substrate S disposed under the third light emitting stack 230 may be removed and subsequent processes may be performed.

The third adhesive layer 253 may be formed of a light-transmitting material, so that light emitted from the first, second, and third light emitting stacks 210, 220, and 230 may be emitted in a direction towards the third substrate S' by passing through the third adhesive layer 253. In addition, the third adhesive layer 253 may have adhesion characteristics capable of bonding the first light emitting stack 210 and the third substrate S' while being an insulation material. These characteristics are also possessed by the first and second adhesive layers 251 and 252 described above, and the third adhesive layer 253 may be formed of a same material as those of the first and second adhesive layers 251 and 252. However, the inventive concepts are not limited thereto, and the first, second, and third adhesive layers 251, 252, and 253 may be formed of different materials from one another.

The third adhesive layer 253 may have different thicknesses in a region overlapping with the first light emitting stack 210 and in a region not overlapping the first light emitting stack 210. According to an exemplary embodiment, the thickness of the third adhesive layer 253 in the region overlapping with the first light emitting stack 210 may be smaller, and the thickness thereof in the region not overlapping with the first light emitting stack 210 may be relatively larger. Accordingly, light generated from the first light emitting stack 210 is effectively transmitted and emitted, and in a partial region of the third adhesive layer 253 formed to be relatively thick, the third adhesive layer 253 may block light, so that light emitted from the second and third light emitting stacks 220 and 230 incident to the first light emitting stack 210 may be prevented from being interfered with and absorbed.

Figure 14A:
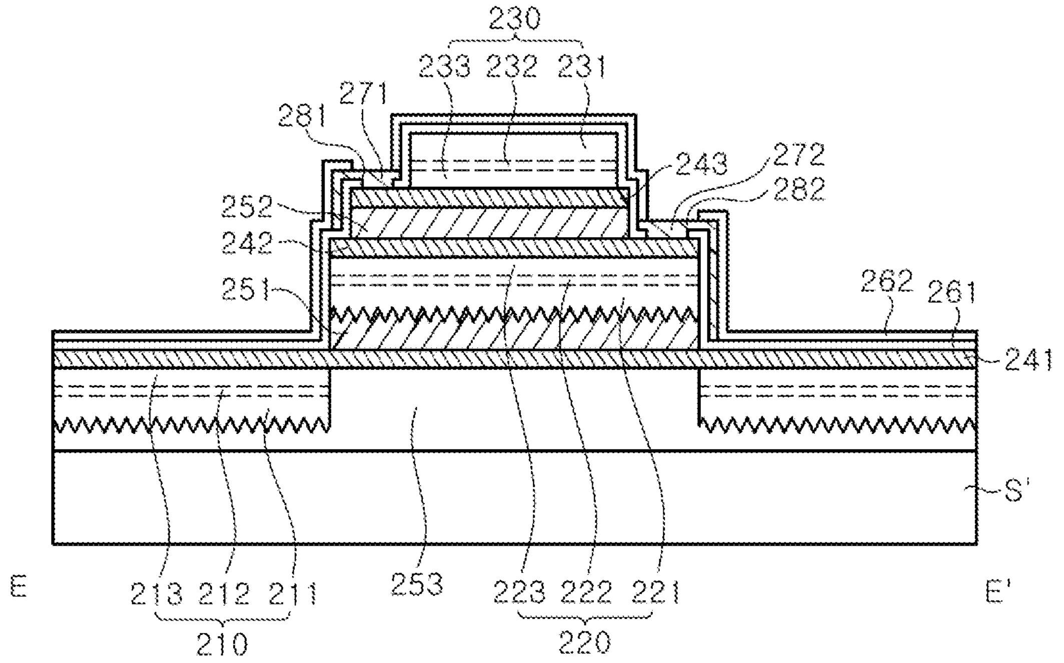
FIG. 14A is a cross-sectional view taken along line E-E' of FIG. 14B according to an exemplary embodiment.
Figure 15:
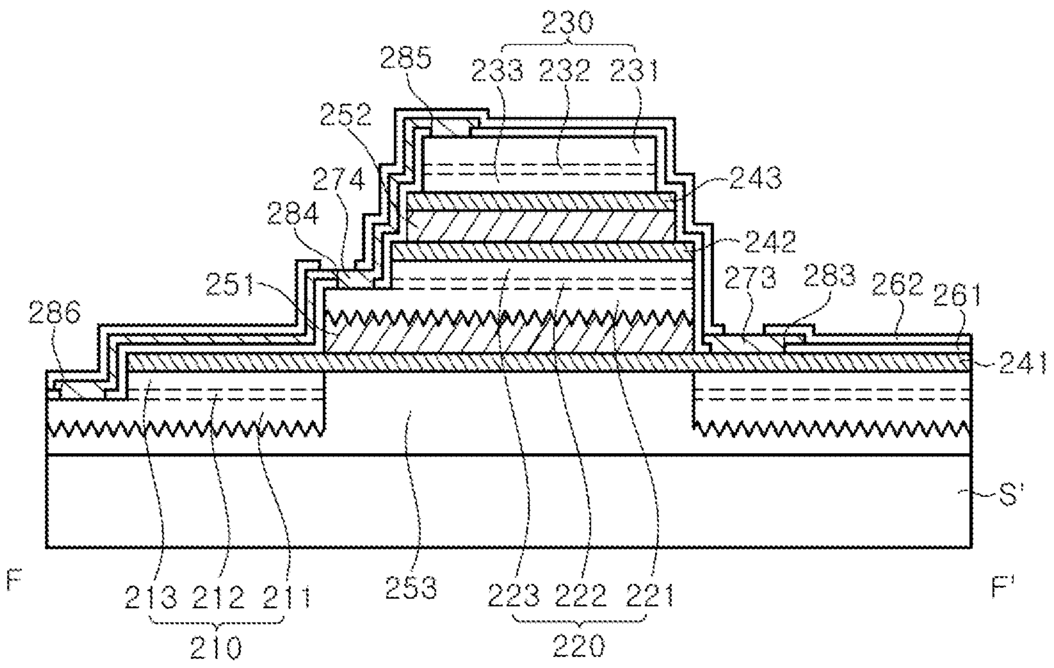
FIG. 15 is a cross-sectional view taken along line F-F' of FIG. 14B according to an exemplary embodiment.

FIGS. 14A and 15 are views where the first light emitting stack 210 is disposed lower than the second and third light emitting stacks 220 and 230 among the first, second and third light emitting stacks 210, 220, and 230 through rotating the light emitting device shown in FIG. 13 by 180 degrees. More particularly, the third substrate S' through which light is emitted to the outside, is disposed on a lowermost portion, and the third light emitting stack 230 is disposed on the uppermost portion. Accordingly, referring to FIGS. 14A and 15, the direction in which light is emitted is a downward direction, that is, toward the third substrate S'. In addition, through an etching process, a deposition process, and the like to the first, second, and third light emitting stacks 210, 220, and 230, first through fourth electrode pads 271, 272, 273, and 274 may be formed to supply electricity to a stacked light emitting diode, that is, the first, second, and third light emitting stacks 210, 220, and 230.

In addition, as the second and third light emitting stacks 220 and 230 are etched, at least a portion of the first light emitting stack 210, more specifically, the first lower contact layer 241 disposed on one surface of the first light emitting stack 210 may be exposed.

In addition, the first light emitting stack 210 may be disposed not to overlap with the second and third light emitting stacks 220 and 230 in plan view of the stacked light emitting diode. In particular, a region of the first light emitting stack 210 that does not overlap with the second and third light emitting stacks 220 and 230 may be included. More particularly, at least a portion of light of the second light emitting stack 220 or the third light emitting stack 230 may be emitted to the outside without passing through the first light emitting stack 210. As such, light generated from the second light emitting stack 220 may be emitted by passing through a region disposed between the side surface of the first light emitting stack 210 and an upper portion of the second light emitting stack 220 among regions of the third adhesive layer 253. Accordingly, as the first light emitting stack 210 and the third light emitting stack 230 are disposed not to overlap with each other, a travel path for light emitted from the light emitting stacks to be emitted to the outside, that is, the number of light emitting stack layers through which light has to pass may be reduced, and thus, a light extraction efficiency may be increased by effectively shortening the travel path of light. In addition, the light emitting area may be maximized by using most of an area of the stacked light emitting diode, thereby improving the luminous efficiency.

In addition, in plan view of the stacked light emitting diode, at least partial regions of the second light emitting stack 20 and the third light emitting stack 230 may be disposed to overlap with each other.

Although not shown in the drawings, according to another exemplary embodiment, partial regions of the first light emitting stack 210 and the second light emitting stack 220 may overlap with each other depending on a degree of etching of the second and third light emitting stacks 220 and 230 in plan view of the stacked light emitting diode. In addition, according to still another exemplary embodiment, at least partial regions of the first, second and third light emitting stacks 210, 220, and 230 may be disposed to overlap with one another, or at least partial regions thereof may be disposed not to overlap with one another.

An overlapping region may overlap at least in a portion adjacent to an outer periphery of the first light emitting stack

210. Accordingly, the overlapping region is minimized, which is effective in improving the light extraction.

Figure 14B:
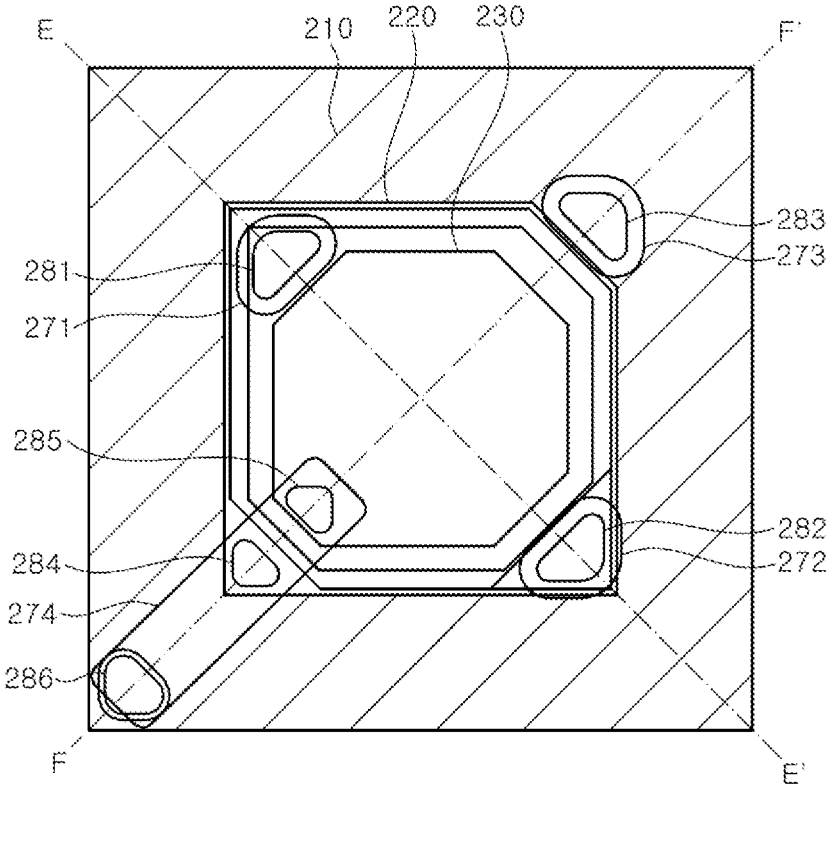
FIG. 14B is a plan view illustrating a plane of FIGS. 14A and 15 according to an exemplary embodiment.

FIG. 14B is a plan view of FIGS. 14A and 15. In particular, FIG. 14A is a cross-sectional view taken along line E-E' of FIG. 14B, and FIG. 15 is a cross-sectional view taken along line F-F' of FIG. 14B.

Referring to FIG. 14B, according to an exemplary embodiment, in plan view, at least a partial region of the first light emitting stack 210 may be exposed without overlapping with the second and third light emitting stacks 220 and 230. The first light emitting stack 210 may be disposed on a peripheral portion of the light emitting diode in which the first, second, and third light emitting stacks 210, 220, and 230 are stacked, and as described above. At least partial regions of the second light emitting stack 220 and the third light emitting stack 230 may be exposed in the central portion where the first light emitting stack 210 is removed. In particular, in plan view, the first light emitting stack 210 may be disposed on the peripheral portion to surround the second light emitting stack 220 and the third light emitting stack 230, and the second light emitting stack 220 and the third light emitting stack 230 may be disposed closer to the central portion than the first light emitting stack 210. More particularly, the first light emitting stack 210 may not pass through the central portion of the stacked light emitting diode, and the second and third light emitting stacks 220 and 230 may be disposed to pass through the central portion of the stacked light emitting diode. Accordingly, the luminous efficiency may be improved by minimizing the region of other light emitting stacks where light emitted from the first light emitting stack 210 should pass while it is possible to secure a widest region of the first light emitting stack 210.

According to an exemplary embodiment, an area occupied by the first light emitting stack 210, that is, an area of the peripheral portion of the stacked light emitting diode may be greater than an area occupied by the second light emitting stack 220 and the third light emitting stack 230, that is, an area of the central portion of the stacked light emitting diode. In particular, a light emitting stack having a relatively low luminous intensity, for example, the first light emitting stack 210 having the luminous intensity lower than those of the second and third light emitting stacks 220 and 230, is disposed to have the widest light emitting area, so that it is possible to maximize the luminous efficiency by efficiently adjusting the luminous intensity through reducing a difference in light quantity emitted from each of the first, second, and third light emitting stacks 210, 220, and 230.

For example, a full color display device may be implemented by stacking light emitting diodes emitting red, green, and blue to display three primary color pixels. In this case, by disposing a light emitting stack having an insufficient luminous intensity in the first light emitting stack 210, the luminous intensity may be increased by maximizing the light emitting area. Accordingly, it is possible to increase the luminous efficiency and a product quality by efficiently adjusting the luminous intensity through reducing the difference in luminous intensity.

According to another exemplary embodiment, although not shown in the drawings, the area of the first light emitting stack 210, that is, the area of the peripheral portion of the stacked light emitting diode may be smaller than the area of the second and third light emitting stacks 220 and 230. In this case, the luminous intensity of light emitted from the second light emitting stack 220 and the third light emitting stack 230 may be lower than that of light emitted from the first light emitting stack 210. In other words, when the luminous intensity of the first light emitting stack 210 is highest, by disposing the first light emitting stack 210 in the peripheral portion having a smallest area, the luminous efficiency may be effectively improved by minimizing a difference in amount of light emitted from the first, second, and third light emitting stacks 210, 220, and 230. However, the inventive concepts are not limited thereto, and the area of the peripheral portion and the area of the central portion of the light emitting diode may be similar with other. For example, if the luminous intensity between the first, second, and third light emitting stacks 210, 220, and 230 is similar to each other, the light emitting areas occupied by the light emitting stacks may be similarly disposed.

In addition, referring back to FIG. 14B, the central portion of the stacked light emitting diode, that is, shapes of the second and third light emitting stacks 220 and 230 are not limited, and they may be formed in various ways, for example, a polygonal shape with some angles, such as a quadrangle, a triangle, a hexagon, an octagon, a rhombus, or the like, or a circular shape, an oval shape, or the like with a curved portion.

According to another embodiment, although not shown in the drawings, referring back to FIG. 11A, when the portion of the first light emitting stack 210 or the central portion is removed, the second light emitting stack 220 may be removed together. As the second light emitting stack 220 is also removed, the second lower contact layer 242 may be exposed in the portion of the first light emitting stack 210 or the central portion. In addition, the portion of the first light emitting stack 210 or the central portion, that is, the third adhesive layer 253 covering a space where the first and second light emitting stacks 210 and 220 are removed and the side surfaces of the first and second light emitting stacks 210 and 220 and covering the upper portion of the first light emitting stack 210 may be disposed to bond the third substrate S' to the first light emitting stack 210.

In addition, when the first substrate S is removed and rotated 180 degrees, the third light emitting stack 230 may be disposed on the upper portion. Through an etching process, a deposition process, or the like to the first, second, and third light emitting stacks 210, 220, and 230, a portion of the second light emitting stack 220, more specifically, the second lower contact layer 242 formed on one surface of the second light emitting stack 220 may be exposed to the peripheral portion of the stacked semiconductor layer. Accordingly, the third light emitting stack 230 may be disposed on an uppermost portion of the central portion of the stacked light emitting diode, and the second light emitting stack 220 and the first light emitting stack 210 may be sequentially stacked and disposed on an peripheral portion surrounding the third light emitting stack 230.

In addition, at least a partial region of the third light emitting stack 230 may include a region that does not overlap with the first light emitting stack 210 in plan view, that is, plan view of the stacked light emitting diode. As the at least a portion of the third light emitting stack 230 is disposed to not overlap with the first light emitting stack 210, a travel path for light emitted to the outside, that is, the number of light emitting stack layers through which light has to pass may be reduced, and thus, a light extraction efficiency may be increased by effectively shortening the travel path of light, and by minimizing a probability that light can be lost inside the semiconductor layer.

In addition, in plan view, at least a portion of the first light emitting stack 210 may be disposed to overlap at least a portion of the second light emitting stack 220. In addition, at least partial regions of the first, second, and third light emitting stacks 210, 220, and 230 may be disposed to overlap with one another, or at least partial regions thereof may be disposed not to overlap with one another.

In addition, in plan view of the stacked light emitting diode, an area occupied by the third light emitting stack 230 may be smaller or larger than an area occupied by the first and second light emitting stacks 210 and 220. In particular, an area of the peripheral portion of the stacked light emitting diode may be smaller or larger than an area of the central portion. In this case, the luminous efficiency may be improved by selectively maximizing a light emitting area occupied by a light emitting stack having an insufficient luminous intensity among the first, second, and third light emitting stacks 210, 220, and 230. In addition, a shape of the third light emitting stack 230, that is, a shape of the central portion of the stacked light emitting diode is not limited and may be formed in various ways.

Figure 16A:
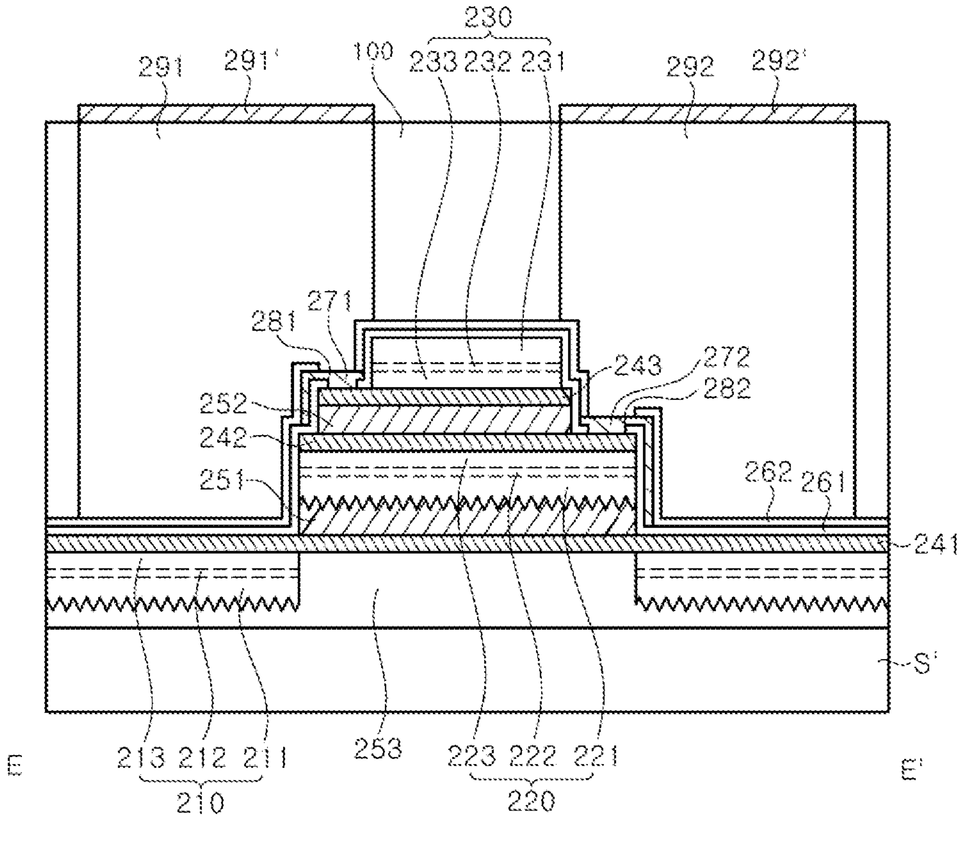
FIG. 16A is a cross-sectional view illustrating taken along line E-E' of FIG. 16B according to an exemplary embodiment.
Figure 16B:
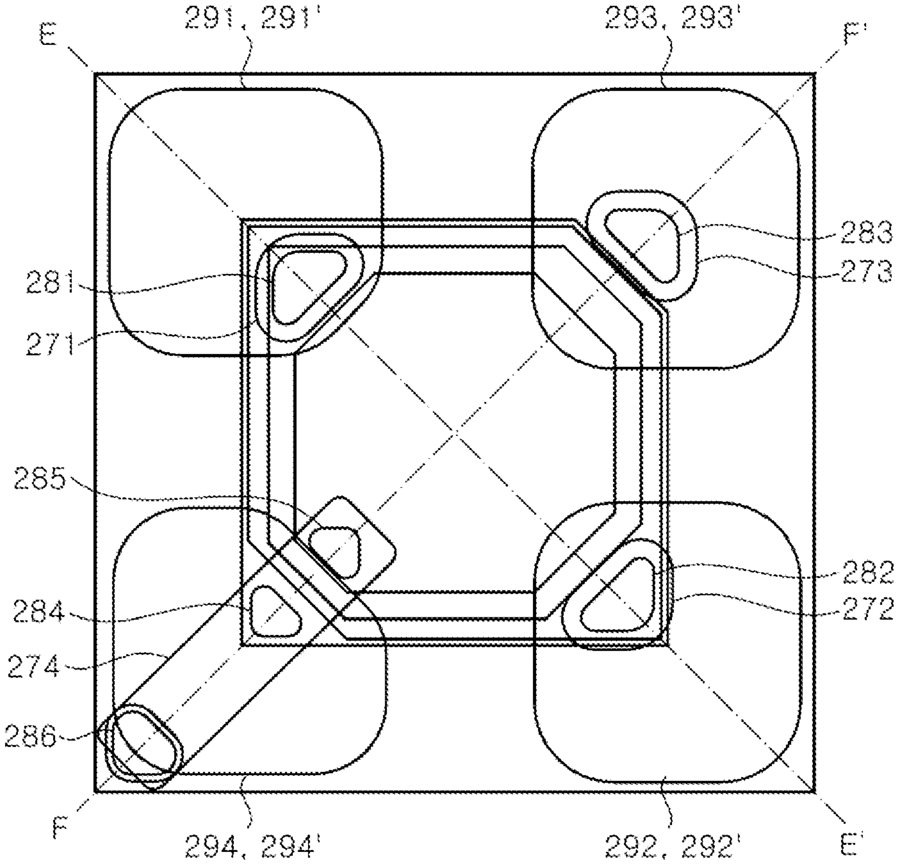
FIG. 16B is a plan view illustrating a plane of FIGS. 16A and 17 according to an exemplary embodiment.
Figure 17:
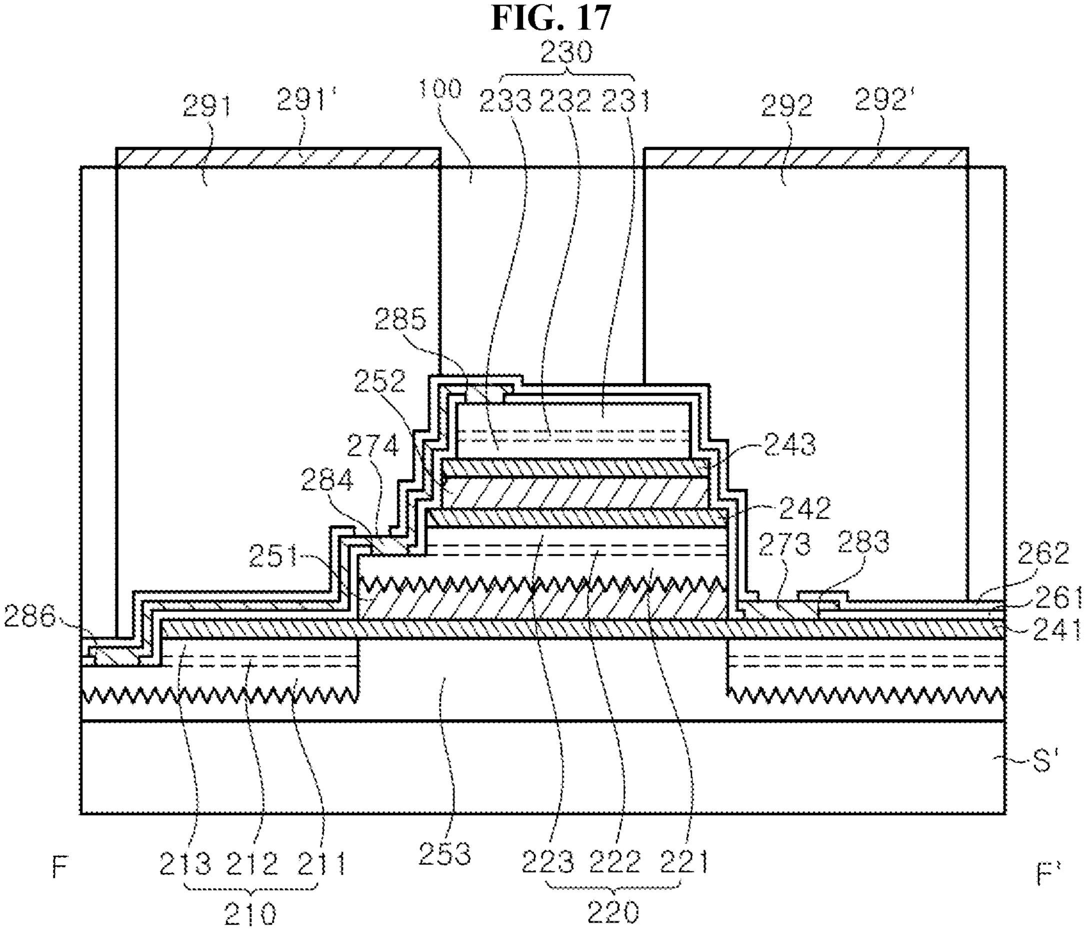
FIG. 17 is a cross-sectional view taken along line F-F' of FIG. 16B according to an exemplary embodiment.

Referring to FIGS. 16A through 17, side surfaces of the first, second, and third light emitting stacks 210, 220, and 230 may be formed to have a stepped shape in a process of stacking and electrically connecting the first, second, and third light emitting stacks 210, 220, and 230. Although not shown in the drawings, shapes of the side surface steps of the first, second, and third light emitting stacks 210, 220, and 230 may include various shapes. For example, the side surface steps of the first, second, and third light emitting stacks 210, 220, and 230 may have an inclined shape having a predetermined angle. The side surfaces of the first, second, and third light emitting stacks 210, 220, and 230 are formed to have an inclined slop shape, so that it is possible to prevent cracks and the like when first through fourth electrode pads 271, 272, 273, and 274 and first and second insulation layers 261 and 262 are deposited on upper side surfaces of the light emitting stacks, thereby improving reliability and product characteristics.

The first and second insulation layers 261 and 262 may be disposed to insulate the side surfaces of the first, second, and third light emitting stacks 210, 220, and 230 and first, second, and third lower contact layers 241, 242, and 243 from the first through fourth electrode pads 271, 272, 273, and 274, and to insulate the first through fourth electrode pads 271, 272, 273, and 274 from first through fourth connection electrodes 291, 292, 293, and 294.

In addition, at least one of the first and second insulation layers 261 and 262 may include a reflection material. For example, the insulation layers may include various organic or inorganic insulation materials, such as $SiO_2$, $SiN_x$, $Al_2O_3$, $TiO_2$, and the like, and at least one of the insulation layers may include a distributed Bragg reflector (DBR). For example, the insulating layer may have a single-layer structure or a multi-layer structure formed of two or more insulation layers having different refractive indices from each other. The material of the insulating layer is not limited thereto, and any material capable of increasing a luminous efficiency by reflecting light and emitting light in a direction of a third substrate S' may be used to form the insulating layer.

FIG. 16B is a plan view of FIGS. 16A and 17. FIG. 16A is a cross-sectional view taken along line E-E] of FIG. 16B, and FIG. 17 is a cross-sectional view taken along line F-F' of FIG. 16B. Referring to FIG. 16B, which shows a plan view in a direction to which electrodes are bonded, rather than a direction in which light is emitted (e.g., not in the direction of the third substrate S'), the first, second, and third light emitting stacks 210, 220, and 230 may be electrically connected to the outside by the connection electrodes 291, 292, 293, and 294 and bonding metal layers 291', 292', 293', and 294'. In addition, the first electrode pad 271 is a P electrode pad of the first light emitting stack 210, the second electrode pad 272 is a P electrode pad of the second light emitting stack 220, and the third electrode pad 273 is a P electrode pad of the third light emitting stack 230. In addition, the fourth electrode pad 274 is a common N electrode pad to which the first, second, and third light emitting stacks 210, 220, and 230 are connected. However, the inventive concepts are not necessarily limited thereto, and in some exemplary embodiments, the first electrode pad 271 may be an N electrode pad of the first light emitting stack 210, the second electrode pad 272 may be an N electrode pad of the second light emitting stack 220, the third electrode pad 273 may be an N electrode pad of the third light emitting stack 230, and the fourth electrode pad 274 may be a common P electrode pad of the first, second, and third light emitting stacks 210, 220, and 230.

In addition, a protection layer 100 may be further included to fill between the first through fourth connection electrodes 291, 292, 293, and 294 and cover side surfaces of the first through fourth connection electrodes 291, 292, 293, and 294. The protection layer 100 may be an insulation material insulating the first through fourth connection electrodes 291, 292, 293, and 294. In addition, the protection layer 100 may include a material capable of reflecting light without absorbing light, so that light may be reflected in the direction towards the third substrate S', which is a direction in which light is emitted, thereby increasing a light extraction efficiency.

In addition, although not shown in the drawings, according to an exemplary embodiment, a contact electrode may be further included on a first conductivity type semiconductor layer 231 of the third light emitting stack 230. The contact electrode may form an ohmic contact with the first conductivity type semiconductor layer 231. A portion of the first conductivity type semiconductor layer 231 may be patterned and recessed, and the contact electrode may be disposed in a recessed region of the first conductivity type semiconductor layer 231 to increase an ohmic contact efficiency. The contact electrode may have a single-layer structure or a multi-layer structure, and may include Al, Ti, Cr, Ni, Au, Ag, Sn, W, Cu, or an alloy thereof, such as an Au—Te alloy or Au-G, without being limited thereto. In addition, the contact electrode may have a thickness of, for example, about 100 nm, and may include metal having high reflectance to increase a light emission effect in a downward direction toward the third substrate S', which is the direction in which light is emitted. In particular, a metal reflection layer having a high reflectance may be disposed on the first conductivity type semiconductor layer 231 of the third light emitting stack 230 disposed on the lowermost portion in the light emitting direction. Accordingly, light irradiated toward the first conductivity type semiconductor layer 231 of the third light emitting stack 230 may be reflected toward the third substrate S', that is, in the direction in which the light is emitted, and thus light can be effectively emitted and light extraction efficiency may be increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A light emitting device, comprising:

a substrate;

an adhesive layer disposed on an upper surface of the substrate;

a first light emitting device;

a second light emitting device disposed laterally adjacent to the first light emitting device;

a first cover layer covering the first light emitting device and the second light emitting device; and connection layers disposed on the first cover layer, and electrically connected to the first and second light emitting devices, wherein:

the adhesive layer has a first thickness over a first region of the substrate above which the first and second light emitting devices are disposed, and a second thickness, different from the first thickness, over a second region of the substrate above which the first and second light emitting devices are not disposed;

the first light emitting device includes a first light emitting structure;

the second light emitting device includes a second light emitting structure and a third light emitting structure;

the first light emitting structure is configured to emit light having a peak wavelength longer than peak wavelengths of light emitted from the second or third light emitting structures;

the second and third light emitting structures are configured to emit light having different peak wavelengths from each other; and a vertical height of a side surface of the first light emitting structure is less than a sum of vertical heights of side surfaces of the second and third light emitting structures.

2. The light emitting device of claim 1, wherein:

the first light emitting structure includes an arsenic or phosphide-based semiconductor layer; and the second and third light emitting structures include a nitride-based semiconductor layer.

3. The light emitting device of claim 1, wherein the second light emitting structure and the third light emitting structure are stacked in a vertical direction.

4. The light emitting device of claim 3, further comprising an adhesive layer coupling the second light emitting structure and the third light emitting structure.

5. The light emitting device of claim 3, wherein:

the second light emitting structure and the third light emitting structure include a first conductivity type semiconductor layer, an active layer, and a second conductivity type semiconductor layer, respectively;

the first conductivity type semiconductor layers of the second and third light emitting structures are electrically connected to each other; and the second conductivity type semiconductor layers of the second and third light emitting structures are electrically isolated from each other.

6. The light emitting device of claim 5, wherein:

the second light emitting device includes an electrode pad electrically connecting the first conductivity type semiconductor layers of the second and third light emitting structures; and one of the connection layers is electrically connected to the electrode pad.

7. The light emitting device of claim 5, wherein:

the second light emitting device includes electrode pads electrically connected to the first conductivity type semiconductor layers of the second and third light emitting structures, respectively; and one of the connection layers is connected to the electrode pads to electrically connect the electrode pads.

8. The light emitting device of claim 3, wherein:

the third light emitting structure is disposed on the second light emitting structure; and the third light emitting structure is configured to emit light having a peak wavelength shorter than that emitted from the second light emitting structure.

9. The light emitting device of claim 1, wherein:

the first and second light emitting devices are disposed on the substrate; and an upper surface of the substrate facing the first and second light emitting devices includes a concavo-convex pattern.

10. The light emitting device of claim 9, wherein bottom surfaces of the first and second light emitting devices facing the substrate have a concavo-convex pattern.

11. The light emitting device of claim 1, further comprising a second cover layer covering the first cover layer and the connection layers, wherein the second cover layer partially exposes the connection layers.

12. The light emitting device of claim 11, wherein the second cover layer and the first cover layer comprise the same material.

13. The light emitting device of claim 12, wherein the first and second cover layers comprise polyimide.

14. The light emitting device of claim 11, wherein the second cover layer covers portions of edges of the connection layers.

15. The light emitting device of claim 1, wherein:

the first light emitting device further includes a sub-light emitting structure; and the sub-light emitting structure is configured to emit light having a peak wavelength longer than the peak wavelengths of light emitted from the second and third light emitting structures.

16. The light emitting device of claim 15, wherein the first light emitting structure and the sub-light emitting structure are bonded to each other by a tunnel layer.

17. The light emitting device of claim 16, wherein the first light emitting structure and the sub-light emitting structure are configured to emit light of a same color.

18. A display apparatus, comprising:

a circuit board; and a light emitting device disposed on the circuit board, the light emitting device comprising:

a substrate;

an adhesive layer disposed on an upper surface of the substrate;

a first light emitting device;

a second light emitting device disposed laterally adjacent to the first light emitting device;

a first cover layer covering the first light emitting device and the second light emitting device; and connection layers disposed on the first cover layer, and electrically connected to the first and second light emitting devices, wherein:

the adhesive layer has a first thickness over a first region of the substrate above which the first and second light emitting devices are disposed, and a second thickness, different from the first thickness, over a second region of the substrate above which the first and second light emitting devices are not disposed;

the first light emitting device includes a first light emitting structure;

the second light emitting device includes a second light emitting structure and a third light emitting structure;

the first light emitting structure is configured to emit light having a peak wavelength longer than peak wavelengths of light emitted from the second or third light emitting structures;

the second and third light emitting structures are configured to emit light having different peak wavelengths from each other; and a vertical height of a side surface of the first light emitting structure is less than a sum of vertical heights of side surfaces of the second and third light emitting structures.

19. The display apparatus of claim 18, further comprising a sub-light emitting structure, wherein the sub-light emitting structure is configured to emit light of a same color as that of the first light emitting structure.

20. The display apparatus of claim 18, further comprising an adhesive layer coupling the second light emitting structure and the third light emitting structure.

* * * * *